United States Patent [19]
Howe et al.

[11] Patent Number: 5,220,568
[45] Date of Patent: Jun. 15, 1993

[54] SHIFT CORRECTING CODE FOR CHANNEL ENCODED DATA

[75] Inventors: Dennis G. Howe, Pittsford, N.Y.; Edward J. Weldon, Jr.; Hugh M. Hilden, both of Honolulu, Hi.

[73] Assignee: Eastman Kodak Company, Rochester, N.Y.

[21] Appl. No.: 433,877

[22] Filed: Nov. 9, 1989

Related U.S. Application Data

[63] Continuation of Ser. No. 200,166, May 31, 1988, abandoned.

[51] Int. Cl.$^5$ .................... H03M 13/00; H03M 7/46
[52] U.S. Cl. ................................ 371/37.1; 341/59; 341/94; 371/42
[58] Field of Search ............... 371/37.1, 37.4, 42, 371/47.1, 39.1; 341/59, 94; 360/53

[56] References Cited

U.S. PATENT DOCUMENTS

| | | | |
|---|---|---|---|
| 4,769,818 | 9/1988 | Mortimer | 371/37.4 |
| 4,829,526 | 5/1989 | Clark et al. | 371/40 |
| 4,872,163 | 10/1989 | Follett et al. | 370/94.1 |

OTHER PUBLICATIONS

Bliss, W., "Circuitry for Performing Error Correction Calculations on Baseband Encoded Data to Eliminate Error Propagation", *IBM Technical Disclosure Bulletin*, vol. 23, No. 10, Mar. 1981, pp. 4633–4634.
Siegel, P., "Recording Codes for Digital Magnetic Storage", *IEEE Trans on Magnetics*, vol. MAG-21, No. 5, Sep. 1985, pp. 1344–1349.
Schneider, H., "Disk System ICs Combat Data Errors", *Computer Design*, Mar. 1985, pp. 147–152.
Lin, S. et al., *Error Control Coding*, 1983, Prentice-Hall, pp. 2–3.
Heemskerk, J. et al., "Compact Disk: System Aspects and Modulation", *Philips Technical Review*, vol. 40, No. 6, 1982, pp. 157–164.
Haykin, S., *Digital Communications*, 1988, John Wiley & Sons, pp. 4–5.

*Primary Examiner*—Stephen M. Baker
*Attorney, Agent, or Firm*—Warren W. Kurz

[57] ABSTRACT

Channel encoded data (for example run length limited encoded data) is further encoded in accordance with a shift correction code prior to transmission. Upon reception, forward and backward shift errors present in the received channel encoded data are corrected by a shift correction decoder. The shift error correction is accomplished using a code, such as (for example) a BCH code over GF(p) or a negacyclic code, which treats each received symbol as a vector having p states. For a single shift error correction, p=3 and there are three states (forward shift, backward shift, no shift). In one embodiment, conventional error correction codewords which encode the user data may be interleaved within successive shift correction codewords prior to channel encoding, thereby enabling the error correction system to easily handle a high rate of randomly distributed shift errors (which otherwise would result in a high rate of short error bursts that exceed the capacity of the block error correction code).

30 Claims, 9 Drawing Sheets

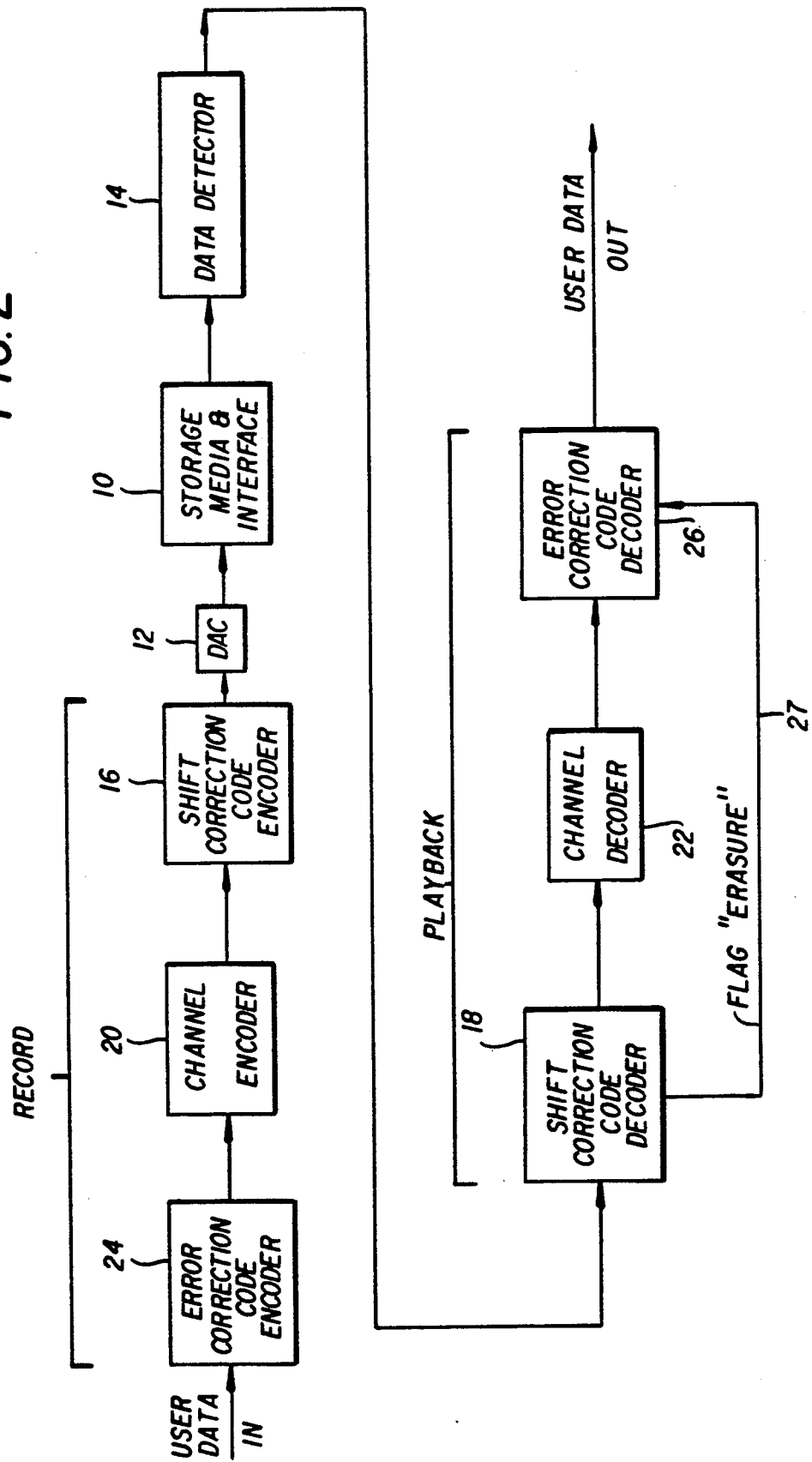

FIG.3a

BINARY USER DATA

ECC ENCODER OUTPUT
(A CODE OVER GF(16) IS
SHOWN; ie., EACH CODE
SYMBOL IS 4 BITS IN
LENGTH)

ECC CODEWORD 0011,0100,1···,···,···,0010,····,···

MESSAGE PATTERN — PARITY PORTION

FIG.3c

ECC ENCODER OUTPUT
AFTER INTERLEAVING
TO DEPTH 5

1st Symbol of ECC Codeword No.1
2nd Sym. of ECC Codeword No.1

0011,1110,1001,0000,0111,0100,0011,1111,.....

1st Symbol of ECC Codeword No. 2
2nd Symbol of ECC Codeword No. 2

FIG.3d

CHANNEL ENCODER OUTPUT
(RATE = 1/2 (2,7) RLL CODE)

SCC ENCODER OUTPUT
(40 CHANNEL BITS = 5
CHANNEL ENCODED ECC
SYMBOLS ARE ENCODED
& 8 PARITY CHANNEL
BITS ARE ADDED - NO
PARTICULAR LSCB
CODE IS ILLUSTRATED)

MESSAGE PORTION OF SCC CODEWORD 0000100010000100010010010000010000100001,
00100100

PARITY PORTION OF SCC CODEWORD

FIG. 3f
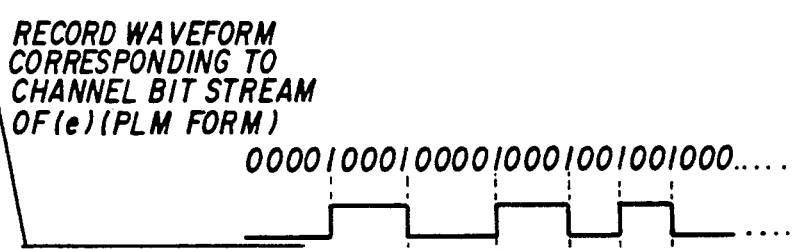
FIG. 3g
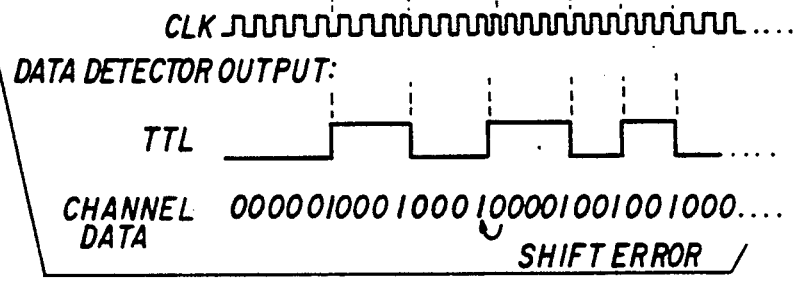
FIG. 3h
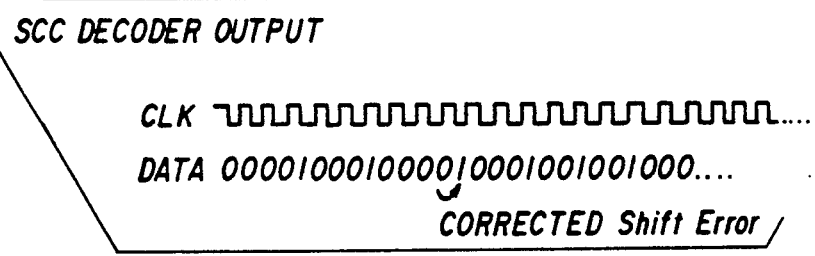
FIG. 3i
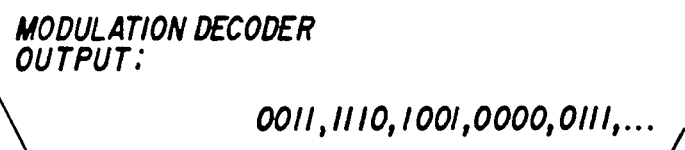
FIG. 3j
ECC DECODER OUTPUT
00110100I......

SCC ENCODER

FIG. 6

GF($3^3$) GENERATED BY $M_1(X) = Z^3 - Z + 1$

| ELEMENT | 3-TUPLE | DEGREE TWO POLYNOMIAL |
|---|---|---|
| 0 | 000 | 0 |
| $a^0$ | 001 | 1 |
| $a^1$ | 010 | $Z$ |
| $a^2$ | 100 | $Z^2$ |
| $a^3$ | 01-1 | $Z-1$ |
| $a^4$ | 1-10 | $Z^2-Z$ |
| $a^5$ | -11-1 | $Z^2+Z-1$ |
| $a^6$ | 111 | $Z^2+Z-1$ |
| $a^7$ | 1-1-1 | $Z^2-Z-1$ |
| $a^8$ | -10-1 | $-Z^2-1$ |
| $a^9$ | 011 | $Z+1$ |
| $a^{10}$ | 110 | $Z^2+Z$ |
| $a^{11}$ | 11-1 | $Z^2+Z-1$ |
| $a^{12}$ | 10-1 | $Z^2-1$ |
| $a^{13}$ | 00-1 | $-1$ |
| $a^{14}$ | 0-10 | $-Z$ |
| $a^{15}$ | -100 | $-Z^2$ |
| $a^{16}$ | 0-11 | $-Z+1$ |
| $a^{17}$ | -110 | $-Z^2+Z$ |
| $a^{18}$ | 1-11 | $Z^2-Z+1$ |
| $a^{19}$ | -1-1-1 | $-Z^2-Z-1$ |
| $a^{20}$ | -111 | $-Z^2+Z+1$ |
| $a^{21}$ | 101 | $Z^2+1$ |
| $a^{22}$ | 0-1-1 | $-Z-1$ |
| $a^{23}$ | -1-10 | $-Z^2-Z$ |
| $a^{24}$ | -1-11 | $-Z^2-Z+1$ |
| $a^{25}$ | -101 | $-Z^2+1$ |
| $a^{26}$ | 001 | 1 |

SHIFT CORRECTING CODE FOR CHANNEL ENCODED DATA

This is a continuation of application Ser. No. 07/200,166 filed May 31, 1988, abandoned.

BACKGROUND OF THE INVENTION

Channel Encoding and Recording

In order to transmit digital data through a communication channel or to record such data in a storage media, such as an optical or magnetic disk, the digital data must first be converted to a time-continuous signal of limited bandwidth. For this purpose, a channel encoder converts (or "modulation encodes") the digital user data into a new sequence of ones and zeroes (called channel bits or channel data) which are constrained in the sense that there must be at least a minimum number of channel "zeroes" between channel "ones", and no more than a maximum number of "zeroes" between "ones". Such a constrained digital sequence is a run length limited (RLL) code. An RLL code can be represented by a sequence of integers (or run symbols) in which each run symbol is assigned a value equal to the number of channel zeroes between successive channel ones. The analog signal to be recorded is usually a pulse train, wherein the distance between adjacent leading and trailing pulse edges is determined by the number of zeroes between successive ones in the channel code. This is a pulse-length-modulated (PLM) waveform. Alternatively, the recorded signal could be a sequence of very short pulses, the spacing of which is determined by the number of zeroes between ones (i.e., a short pulse corresponds to every "one"). This alternative recording waveform is a pulse-position-modulated (PPM) waveform. PPM waveforms are widely used in optical recording while PLM is used in magnetic recording as well as optical recording. In order to retrieve the recorded data (or to receive transmitted data) which has been thus channel encoded, a channel decoder must be used to translate the channel encoded data back into its original digital form. An RLL channel code is characterized by two quantities, D (the minimum allowable number of zeroes between successive ones) and K (the maximum allowable number of zeroes between successive ones). In disk recording, D is constrained by the resolution, or the minimum spot size that can recorded and read back on the disk media, while K is constrained by the ability of the channel decoder electronics to maintain synchronization and phase lock with the recorded channel bits.

The user digital data to be transformed by the channel encoder prior to recording, typically, has been previously encoded in accordance with an error correction code. This requires that the user information data be partitioned into blocks which include additional redundant data computed from the user information data in accordance with the error correction code. Upon playback of the recorded data (or upon reception of transmitted data) and after channel decoding, an error correction decoder uses the redundant data to locate and remove errors in the playback (or received) user data. Significantly, the error correction coding is done on the user data before such data is channel encoded into channel data, and the error correction decoding is done on received user data obtained by channel decoding the received channel data. Thus, conventional error correction techniques operate on the user data, that is, it operates "outside" the channel code.

The additional redundant bytes of data used for the "outside" error correction purpose is an overhead or burden on the overall system because it, in effect, slows down the rate at which user information may be recorded and played back (or transmitted and received), since no user information data may be recorded while the additional redundant data are being recorded. The more errors that the "outside" error correction code may correct, the greater the overhead or number of redundant data bits. Thus, a tradeoff is always presented to a system designer between the density and rate at which user information may be recorded or transmitted and the capacity of the error correction code.

Problem Recognized By The Invention: Noise-Induced Shift Errors

A discovery of the present invention is that during recording or playback of the analog signal representing the channel encoded data, the leading and trailing pulse edges in the PLM case, or the short pulse center positions in the PPM case, may be distorted by noise so that the relative position of a detected "one" in the received run length limited channel encoded data may be shifted, thus apparently increasing the number of zeroes on one side of that "one" while decreasing the number of zeroes on the other side. Such errors propagate during channel decoding. This is due to the fact that channel decoders must consider more than one channel bit at a time to infer what the user data is. For example, in a widely used 2,7 RLL code, two channel bit are used to represent each data bit and as many as eight channel bits are needed to decode a single data bit. New channel bits are read (shifted) into the decoder in pairs (two at a time) so a bad channel bit will be in the decoder for four shifts, or equivalently, four data bits. Thus, a single erroneous channel bit can corrupt four data bits when IBM (2,7) RLL code is used. A shift error can corrupt five data bits, so that a single shift error can produce an error burst that is five user bits long in the channel decoded data stream. Thus, one single shift error can corrupt two adjacent bytes in the channel decoded data. If in this example the outside ECC is a GF($2^8$) Reed-Solomon ECC, it must have at least four parity bytes (32 bits) in each codeword in order to correct such an error burst, a significant overhead.

Problem To Be Solved By The Invention

The problem is how to endow a system with the ability to correct noise-induced shift errors without such a disproportionate increase in overhead of the outside error correction code. Ameliorating or solving this problem might seem impossible, in view of the principle of error correction code theory namely, for Reed-Solomon codes for example, a given increase in the correction capacity of an error correction code requires a two-fold increase in the number of redundant symbols or overhead in each codeword.

SUMMARY OF THE INVENTION

In the present invention, an error correction outer code which encodes the input user data is augmented with a shift correction inner code which encodes the modulation encoded channel bits. The shift correction inner code is dedicated to detecting and/or correcting noise-induced shift errors, or detecting medium defect related hard errors in the run length limited channel encoded data. The invention is thus a shift error correction encoding/decoding process which operates "inside" the channel encoding/decoding process which in turn operates inside the ECC encoding/decoding process.

One aspect of the invention is to employ a shift correction code to effect resynchronization of the channel decoder and to establish synchronization among the outside ECC codewords. In this aspect of the invention, the usual resynchronization field found in the prior art may be advantageously discarded, in order to reduce overhead. Another aspect of the invention provides a means (via the shift correction code) of correcting errors due to loss of clock phase in the channel decoder (sometimes called "bit slips" in the art).

Solution To The Problem

The channel bit stream is partitioned into blocks of run symbols which each form the message portion of an SCC codeword. A transformation is then used to reduce the effect of any shift error (necessarily involving two adjacent run symbols) such that it produces an error in only a single symbol, thus dramatically minimizing the redundancy overhead (i.e., number of check symbols) required to correct such an error.

A second transformation of the transformed symbols converts them to elements of a selected code, such as elements of the finite field $GF(3^m)$, which facilitates the use of BCH or negacyclic codes to correct the shift error. Redundant check symbols are then appended to each block in accordance with the code to form the SCC codeword.

The redundant ("check") symbols of the shift correction inner code may functionally replace the usual resynchronization fields generally required in very high density disk recording data formats, so that the "additional" check symbols required by the shift correction inner code may present virtually no additional overhead compared with prior art recording systems. The additional overhead of the redundant check symbols required by the shift correction inner code is "washed out" by the elimination of some or all of the resynchronization field bits.

Interleaving

The synergy between the shift correction inner code and the error correction outer code is further exploited in one embodiment of the invention by interleaving a predetermined number of "outside" error correction codewords within successive shift correction codewords prior to transmission or recording. In this embodiment, when the data is received or played back, the shift correction decoder notifies the outside error correction decoder whenever the capacity of the shift correction decoder is exceeded (signifying that the current shift correction codeword is not decodable). Upon receiving this information, the downstream error correction decoder treats the data thus flagged by the shift correction decoder as an erasure. Preferably, the interleaving of the inner and outer codes is on an outer code symbol basis, so that such erasures are no greater than one symbol long in a given outside error correction codeword. In accordance with well-known principles, the outside error correction code's capacity for handling erasures is twice as great as its capacity for handling errors, or, conversely, the overhead required to correct a given number of erasures is less than (about one half) the overhead required to correct the same number of errors. Thus, in this embodiment of the invention, the combined redundancy of the inner and outer codes in this system is even further reduced.

It should be noted that, prior to the present invention, there was no guaranteed method of detecting shift errors in the channel encoded data stream. Noise-related shift errors usually do not result from playback waveform peaks which are unusually low, nor do they produce RLL code D,K constraint violations. They usually are not detectable as erasures.

Shift Correction Code

The shift correction code of the invention detects and corrects noise-induced shift errors in the run length limited channel encoded data much more efficiently than prior art error correction code techniques. This is because the invention works directly inside the channel encoded data stream (thereby avoiding modulation decoding-related error propogation). It employs unique transformations (mentioned previously herein) prior to shift correction encoding which reduce the number of SCC symbols affected by a given shift error in the channel encoded data. Finally, the invention allows the skilled worker to use a conventional code as the shift correction code, including any of the BCH and Reed-Solomon codes accessible to the skilled worker.

The first transformation mentioned above computes a new sequence of symbols which are the sum of each run symbol in a block with all preceeding run symbols in the block. Each noise-induced shift error in the transformed block of data, instead of producing an error in two successive run symbols, produces an error in only one such sum symbol. This advantageously reduces the number of redundant check symbols required to correct such a shift error by a factor of two or more, depending upon the code used.

The second transformation permits the representation of the channel encoded data as a polynomial having coefficients drawn from elements of $GF(p)$, where p is an odd integer. This allows one to use any of the known linear systematic cyclic codes to effect efficient correction of shift errors.

A preferred embodiment of the invention uses a BCH code (or an equivalent code such as a negacyclic code) over $GF(p)$, i.e., each code symbol is drawn from $GF(p)$, where p is an odd integer and is greater than or equal to 3. If the shift correction code is designed to correct only single shift errors (namely, a shift error in which the shift distance is no greater than one channel bit), then the code symbol is viewed as having only three states (forward shift, backward shift or no shift) and $p=3$. A single shift error shifts a channel one by one channel bit, a double shift error shifts it by two channel bits. The invention encodes over $GF(3)$ to correct single shift errors, over $GF(5)$ to correct double shift errors, over $GF(7)$ to handle triple shift errors, etc. Since a double shift error is $10^5$ to $10^{10}$ times less probable than single shift errors, the single shift error case is the most interesting. The number of correctable single shifts in a given block or SCC codeword is determined by the number of redundant parity symbols in the SCC codeword. Since a given shift error affects only one first transformed symbol or equivalently, only one SCC codeword symbol, a minimal amount of overhead is required to correct noise-induced shift errors in the channel encoded data.

DESCRIPTION OF THE DRAWINGS

The invention may be understood by reference to the accompanying drawings, of which:

FIG. 2 is a block diagram illustrating the system of the invention;

FIGS. 3a–3j include contemporaneous timing diagrams illustrating the operation of the system of FIG. 2;

FIG. 6 is a listing of $GF(3^3)$ generated by $m_1(Z) = Z^3 - Z + 1$; and

DETAILED DESCRIPTION

The Nature Of Noise-Induced Shift Errors In Channel Encoded Data

Figures 1A, 1B, 1C, 1D, 1E:
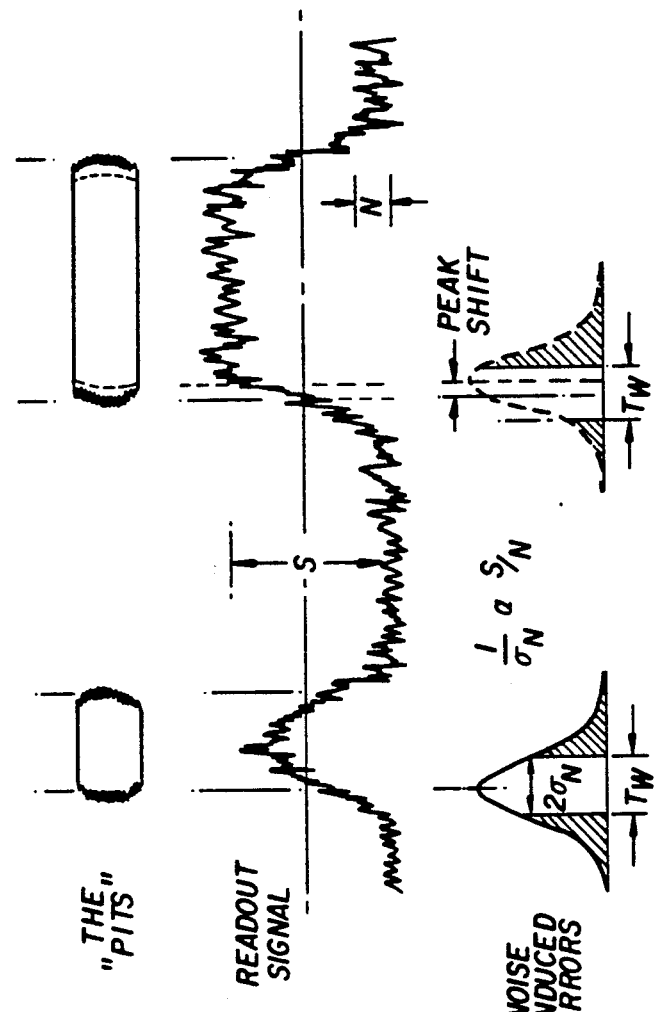
FIGS. 1a–1e include contemporaneous timing diagrams illustrating the problem of noise-induced shift errors in channel encoded data.

Referring to FIG. 1a, channel data encoded as a (1, 7) run length limited code (D=1, K=7) is illustrated together with the corresponding analog PLM recording waveform. Each binary one in the run length limited code coincides with a leading or trailing pulse edge in the analog PLM signal. FIG. 1b illustrates the corresponding "pits" in an optical disk in which the analog signal of FIG. 1a is embedded. The dashed curves near the leading and trailing edges of the rightmost pit indicate the edges of the shortened pit that would have been recorded if distortions such as a slight defocus or a lowering of recording laser power has occurred when this pit was written. FIG. 1c illustrates the corrupting effect of noise on the signal read out from the disk "pits" of FIG. 1b. The noise is approximated as white-Gaussian for purposes of discussion and analysis—it is possible that the noise can have some other statistics in a given system, but that does not affect the SCC code methodology, although it may effect the code one chooses to use. One would code over GF(5) rather than GF(3) if double shift errors have a non-negligible probability, and type of code used and number of parity symbols would depend upon the number of expected shift errors in the SCC codeword. FIG. 1d illustrates the probabilistic distribution of detected pit edges that results when Gaussian noise corrupts the readout signal of FIG. 1c, and particularly illustrates how the leading edge of the second pit of FIG. 1b (or the second pulse of FIG. 1a) appears to be time shifted by one channel bit due to the presence of distortion (intersymbol interference) together with the Gaussian noise. The root mean square deviation, $\sigma_n$, of the Gaussian transition detection probability distribution of FIG. 1d is proportional to the inverse of the signal-to-noise ratio (S/N) of the FIG. 1c playback signal. The root mean square deviation $\sigma_n$ characterizes (probabilistically) the distance that noise will shift or move a binary channel "one" in the run length limited code recovered from the "pits" of 1b, this distance being one bit in the example of FIG. 1e (the channel data in 1e contains one single shift error).

Significantly, the single shift error of FIG. 1e created an error in not one but two adjacent run symbols which represent the received run length limited code. Specifically, the second symbol, represented by five zeroes in the "correct" code of FIG. 1a, has been changed to six zeroes in the "readout" code of FIG. 1e, while the third symbol represented by four zeroes in the "correct" run length limited code of FIG. 1a has been changed to only three zeroes in the "readout" code of FIG. 1e.

The main purpose of the present invention is to detect and correct shift errors which: (a) have not caused RLL constraint violations (and thus are not detectable using prior art techniques) and (b) would otherwise cause a short error burst (i.e., an incorrectly decoded sequence from one to ten user bits long-due to RLL decoding error propogation) to be presented to the "outside" ECC decoder for correction.

Shift Correction Code

Referring to FIG. 2, the system of the invention includes a channel 10 typical of either a data communication channel or a data storage system such as a disk drive. Digital channel data is transmitted to the channel through a digital-to-analog converter 12 and is read out of the channel through a data detector 14 which outputs a TTL data signal analogous to the record waveform as well as a clock that is synchronous with it. A shift correction code (SCC) encoder 16 is connected after a channel encoder 20 to the input of the digital-to-analog converter 12 and a shift correction code (SCC) decoder 18 connected ahead of a channel decoder 22 to the output of the data detector 14.

The shift correction code of the SCC encoder 16 and SCC decoder 18 may work in conjunction with an error correction code. For this purpose, an error correction code (ECC) encoder 24 is connected upstream of the channel encoder 20 while an error correction code (ECC) decoder 26 is connected downstream of the channel decoder 22. The purpose of the SCC encoder 16 and the SCC decoder 18 is to detect and possibly correct any noise-induced shift errors which may be present in the channel encoded data received by the channel decoder 22, so that the user data error bursts that result from channel decoding of the channel bit stream in the neighborhood of such shift errors do not reach the ECC decoder 26 or are flagged as erasures if they do reach the ECC decoder 26. The net advantage of this is that the overhead of redundant check symbols required by the ECC encoder 24 may be substantially reduced since the "outside" ECC will not have to directly deal with the (potentially pathologic) high incidence of short error bursts caused by the anticipated level of noise-induced shift errors in the received channel encoded data. The error correction code which works on the user data is augmented by the shift correction code which works on the channel data in the system of FIG. 2.

The binary data (FIG. 3a) to be recorded enters the "outside" ECC encoder 24 which encodes the message by partitioning the user data into blocks (messages) and adding some redundant check bits at the end of each block to produce ECC codewords (FIG. 3b). Before output of the ECC encoded user data, the ECC encoder may interleave the individual ECC codewords (in order to randomize long error bursts). If interleaving is done to depth I, the first symbol of each of the first I codewords are sequentially output, followed by the second symbols of those I codewords, etc. (FIG. 3c). The channel encoder 20 then encodes the ECC encoded binary data by transforming it into a D,K constrained binary sequence (FIG. 3d). The SCC encoder 16 then encodes the channel bit stream of FIG. 3d by selecting a block of 1 contiguous channel bits (which preferably encompasses an integral number of ECC code symbols), computing the sequence of RLL code constrained channel bits that constitute the SCC parity or check symbols and appending those SCC check channel bits to the 1 message channel bits to form an SCC codeword. FIG. 3e illustrates the case in which the SCC codeword's message portion corresponds to the first five ECC symbols output by the interleaving ECC encoder. The digital-to-analog converter 12 then transforms the RLL data of FIG. 3e to an analog voltage waveform (FIG. 3f). This waveform is recorded on the storage media 10.

During playback, the data detector 14 receives the analog waveform that corresponds to the recorded data and outputs a TTL waveform similar to the record waveform in (FIG. 3f) as well a synchronous clock. However, in this example (FIG. 3g) there is a shift error in the playback RLL data. The SCC decoder 18 uses the SCC redundant check bits to remove the shift error, leaving a shift-error-free channel bit stream (FIG. 3h). In the event that the errors (shift or otherwise) in the SCC codeword cannot be handled by the SCC, the SCC parity checks are stripped away, the received message portion of the SCC codeword is passed to the modulation decoder and a flag is enabled that marks the integral number of outside ECC symbols corresponding to (i.e., mapped into) the SCC codeword as erasures. The modulation decoder 22 now uses the clock and channel bit stream passed to it by the SCC decoder to reconstruct the ECC encoded user bit stream (FIG. 3a). The ECC decoder 26 then employs the ECC redundant check bits and any erasure information to remove any dropouts or bit errors in the ECC encoded user data (in this simple example there are none). What is left is the original binary user data (FIG. 3j).

Synchronization Features

A. Channel Bit Synch: A conventional modulation decoder (of the type to be employed to accept the SCC decoder output, cf., FIG. 3g through FIG. 3i) requires both the channel data (bit stream) and a clock that is synchronous and properly phased with the channel data in order to decode the channel data into user data. In fact, if a phasing error (conventionally called a bit-slip) occurs between the channel clock and data, misdecoding will usually occur. This can be seen by considering the following example:

| 2.7 Coding Table | |
|---|---|
| User Data | 2.7 RLL Data |
| 1 0 | 0 1 0 0 |
| 0 1 1 | 1 0 0 0 |
| 0 0 0 | 0 0 0 1 0 0 |
| 0 1 0 | 1 0 0 1 0 0 |
| 0 1 1 | 0 0 1 0 0 0 |
| 0 0 1 0 | 0 0 1 0 0 1 0 0 |
| 0 0 1 1 | 0 0 0 0 1 0 0 0 |

Using the (2,7) coding table supplied above, it can be seen that the channel bit stream 0 0; 0 1, 0 0, 0 1, 0 0, 1 0, 0 0, 0 0 (where the commas demark the boundaries, or phasing, of the received channel data, i.e., they specify the proper pairing of each two channel bits that correspond to a single user bit) decodes to the following user data bit stream (when decoding starts at the semicolon):

. 1 0 1 0 1 1 .. i.e., 0 0; 0 1, 0 0, 0 1, 0 0, 1 0, 0 0, 0 0   Channel Data
. ; 1    0;    1   0;    1    1; .    User Data If the clock (phasing) slips by one channel bit to the left, the same channel bit stream will mis-decode to the user data stream . 0 1 1 0 1 0 0 .. i.e., 0; 0 0, 1 0, 0 0, 1 0, 0 1, 0 0, 0 0, 0   Channel Data
.; 0    1   1;   0    1   0;   0  .    User Data One could ensure automatic resetting of the channel clock phase by recognizing (from the 2,7 coding table) that a passage of channel data consisting of seven zeroes nested between "ones" can only occur such that the "ones" are the first bits of a channel bit pair ( . . . , 00, 10, 00, 00, 00, 10, . . . ) and verifying/resetting the channel clock phase each time such a channel bit passage occurs. However, this is risky since a hard (medium defect) error could randomly eliminate a channel one and cause a mis-adjustment of clock phase to randomly occur. In order to ensure maintenance of channel clock phase in prior art systems which have a high rate of dropouts, special patterns of channel data (called bit resync fields) are embedded into the recorded channel data stream. Such bit resync fields are chosen so that they are detected with high probability in the received channel bit stream; when detected they are used to verify/reset the channel clock phase. The overhead associated with such bit resync fields can be quite high, as much as 10%, or one byte of resync for every 10 bytes of recorded user data.

The SCC code of the present invention can be defined by the skilled worker such that a known number of channel bits are contained in each of the information and parity parts of the SCC codeword; bit resync can be verified/reset on these boundaries. This process is especially practical if the two parts of the SCC codeword are made to start with a channel "one". This feature is easily obtained if a (D,K) RLL code is used that admits to an encoder having reset data blocks which reset the encoder to a fixed state (which corresponds to the sending of a channel "one"). Such an RLL code (and encoder) are described in U.S. Pat. No. 4,413,521. Alternatively, a minimal number of "linking" channel bits can be appended to the ends of both the information and parity parts of the SCC codeword to effect such operation.

In addition, the occurrence of a channel bit "slip" can be detected with high probability when the syndrome of the received SCC codeword is computed by the SCC decoder. Once a bit slip is detected, the system can be flagged to adjust the channel clock phase when channel decoding is attempted, thereby increasing the probability of correct data recovery. Thus the invention provides via the SCC code a reduced reliance on bit-resync fields for reliable data recovery. In fact, the overhead associated with the SCC code parity channel bits (and linking channel bits, if any) will be partially or totally offset by the reduced number of resync channel bits that may be required.

B. Symbol (Character or Byte) Synch: In order to decode the "outside" ECC codewords, the boundaries between individual ECC codewords in the received data must be identified. More specifically, individual "outside" ECC symbols must be recognized and addressed (i.e., labeled as to which interleaved codeword they belong and what sequential position they occupy in that codeword). This process is known as symbol or character synchronization. It is common practice to initialize character synch by detecting special fields (called address marks) recorded in the header section of each sector of data in a data storage system, and further to record a known number of user data bits (or equivalently, ECC symbols) in a given sector or between bit synch fields in the data portion of the sector so that character synch can be verified/reset on those boundaries. Since the information portion of an SCC codeword contains an integral number of ECC symbols and its parity portion contains a known number of parity channel bits, the SCC codewords themselves can be used to establish boundaries that may be used to verify/reset character synch. Thus, the conventional resync fields may be dispensed with to reduce overhead.

C. Auto-phasing Via the SCC: The symbols of the recorded SCC encoded data itself are essentially integers ranging between D and K, where (D,K) are the parameters of the (D,K) RLL code used in conjunction with the SCC. These symbols are recovered in the SCC decoder from the channel data and clock output by the data detector (cf., FIG. 3g and 3h) simply by counting the number of channel clock cycles that elapse between adjacent channel data "ones". It is not required that the channel clock be phase-locked to the channel data in order to enable SCC decoding —all that is required is that the clock is synchronous (i.e., running at proper frequency) with the recovered channel data. An example of such a counter would be a shift register which is clocked by transitions in the arriving channel clock, and which has its output initiated by the arrival of (input of) a channel "one". Since the SCC decoder will readily recognize SCC codeword boundaries, it can be made to synthesize a channel clock that is synchronous with, and has proper phase with respect to, the channel data that is output by the SCC decoder to the modulation decoder. Thus, the SCC decoder will establish automatic synchronization and phasing of the channel clock and data presented to the RLL decoder, and in this way will improve the system's tolerance to jitter.

Shift Correction Code Encoder

Figure 4:
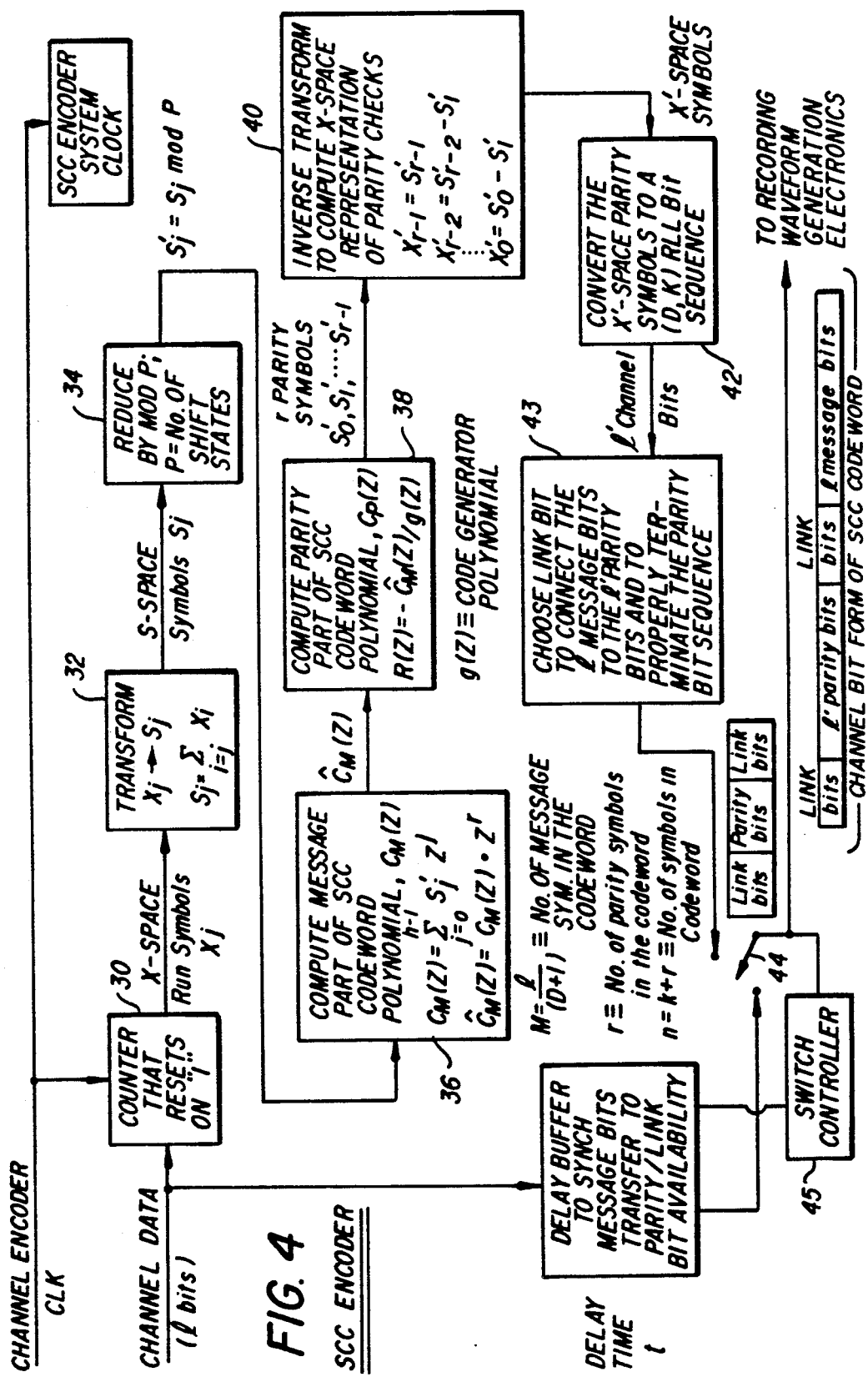
FIG. 4 is a block diagram illustrating the shift correction encoder used in the system of FIG. 2.

The SCC encoder 16 of FIG. 2 is illustrated in greater detail in the block diagram of FIG. 4. The SCC encoder 16 treats the D,K constrained sequence of channel bits sent from the channel encoder as a sequence of individual run symbols, $x_j$, in "x-space". The run symbols, $x_j$, are computed in a counter 30 that counts the modulation encoder clock cycles that elapsed between the arrival of contiguous channel "ones". The message portion of the SCC codeword will consist of a number, l, of channel bits, or equivalently, a maximum of $k=l/(D+1)$ run symbols $x_j$. In a preferred embodiment l will correspond to an integral number of outside ECC code symbols. If the ECC is based on $GF(2^m)$ then lR mod $2^m = 0$, where R is the rate (user bits per channel bit) of the RLL modulation code. The SCC encoder communicates with the modulation encoder via a buffer (not shown in FIG. 4) which sends l channel bits at a time. Such a buffer may need to pause for a time T between sending intervals if the SCC encoder does not compute the SCC parity checks in real time. Each run symbol, $x_j$ is applied to a forward transform processor 32. The processor 32 transforms the x-space data into "s-space" data wherein the $j^{th}$ s-space symbol is obtained by computing the sum of the previous (k−j) run symbols that are received for a given block $$(\text{i.e., } S_j = x_{k-1} - x_{k-2} \ldots - x_j).$$

as denoted in FIG. 4 (Note: j, the index of $x_j$ and $S_j$ runs from 0 to (k−1).) Each symbol $s_j$ of the s-space data is then reduced by dividing it by a number p and discarding all but the remainder of the division; this is done in a processor 34. Such an operation is called reducing each symbol modulo p, and we define $s'_j = s_j \bmod p$.

The number p is the number of shift states, and is usually equal to three (forward shift, backward shift, no shift). The number p is one plus twice the maximum length in channel bits of a shift error in the RLL data. Typically, only single shift errors are to be corrected, so p=3, and all the s-space symbols $s_j$ are reduced modulo 3. The SCC code itself is a linear, systematic, cyclic code over GF(p), i.e., the symbols of the code are elements of GF(p).

A processor 36 forms an s'-space message polynomial $C_M(Z)$ from the succession of symbols $s_j \bmod p$ in the data block. Thus, the maximum degree of this message polynomial is (k−1) where $k=l/(D+1)$ and l is the number of message channel bits in the SCC codeword. As denoted in FIG. 4, the message polynomial $C_M(Z)$ is simply a polynomial in powers of z in which the s'-space symbols $s'_j$ are employed as individual coefficients of the powers of z. The message polynomial $C_M(Z)$ is "shifted" by multiplying it by $Z^r$ to form a shifted message polynomial $\hat{C}_M(Z)$. The number r is equal to the number of GF(p) parity symbols that ultimately will be appended to the message portion of the SCC codeword by the SCC encoder. The shifted message polynomial, $\hat{C}_M(Z)$, is then divided by a code generator polynomial g(Z) (whose selection is discussed below) in a processor 38. The results of this division are disregarded except for a remainder R(Z) "left over" following the polynomial division operation. (This is called reducing $\hat{C}_M(Z)$ modulo g(Z).) R(Z) itself is a polynomial of degree (r−1) and its coefficients (which are elements of GF(p)) constitute the sequence of SCC code symbols which are the parity checks. The parity check symbols, which are taken as elements of s'-space, are then inverse transformed in a processor 40 from s'-space to x'-space and the result comprises the "x'-space" representation of the SCC check symbols (to be appended to the message portion of the SCC codeword to form a complete SCC codeword). This inverse transformation is performed by solving the set of r simultaneous equations denoted in FIG. 4 in connection with the inverse transform processor 40. The r run symbols $x'_j$ thus obtained are the mod GF(p) reductions of the run symbols $x_j$ that constitute the actual channel bit sequence corresponding to the parity portion of the SCC codeword. Since the value of each $x'_j$ will be some integer in the range 0 to (p−1), the corresponding sequence of channel runs $x_j$ can be obtained from $x'_j$ by adding $x'_j$ zeroes to the sequence consisting of D channel zeroes, i.e., $x_j = x'_j + D$. This operation is necessary so that the channel bit stream that is associated with the parity portion of the SCC codeword will obey the RLL code's (D,K) constrains. The conversion of the r-tuple of x'-space symbols which correspond to the parity checks of the codeword to an actual RLL constrained sequence of channel bits is accomplished by circuitry 42 in FIG. 4. As an example, suppose r=4 and p=3 (i.e., the SCC works over GF(3)): Then $0 \leq x'_j \leq 2$ for j=1 through 4. And, if an RLL code with D=2 is being used, the maximum length of the channel bit sequence corresponding to the SCC parity checks will be 20 channel bits, i.e., the maximum length channel bit sequence is 10000, 10000, 10000, 10000.

Although the above-described method of converting from parity symbol r-tuples to RLL constrained channel bits is simple, it is relatively inefficient. That this is the case can be seen by referring to Table I which lists versus sequence length both (i) the number of 2,7 constrained sequences beginning with a "one" and ending with either a "one" or an arbitrary number of "zeroes" (less than 8), and (ii) the number of 2,7 constrained sequences that begin with a "one" and end with at least two, but less than 8, "zeroes". Clearly, for better efficiency, the 81 possible parity sequences for our example case (i.e., p=3 and r=4) could be encoded uniquely via a much shorter 15 bit long 2,7 sequence that begins with a "one" and ends arbitrarily (since 105 such sequences are possible). Alternatively, a 17 bit long 2,7 sequence beginning with a "one" would be required if we demand that the sequence end with at least two "zeroes". (Why such a sequence is desirable will be discussed below.)

As was discussed earlier, the use of an SCC code will produce enhanced synchronization capabilities if the transmitted (recorded) SCC codewords are fixed in length and both their message and parity parts start with a channel "one". To enable this feature, a fixed number of link channel bits are always inserted (via circuitry 43 in FIG. 4) after the channel bit sequences that represent both the message and parity portions of the SCC codeword. (Such link bits are necessary whenever the message or parity parts end with less than D "zeroes"). As an example, if 2,7 RLL code is used, 3 linking channel bits are required to be added to the message part of the channel bit stream as follows:

message part ends in 0 1; link bits are 0 0 0
 message part ends in 1 0; link bits are 0 0 0
 message part ends in 0 0; link bits are 1 0 0

(This last pattern is needed to guard against >7 sequential zeroes.) Thus, in the case of our example, the channel bit encoded parity portion of the SCC codeword would be 18 channel bits long if the arbitrarily-ending 15 bit pattern plus 3 link bits were used, and 17 bits long if the 2,7 sequence starting with a "one" and ending with $\geq 2$ "zeroes" were used to represent the parity part of the SCC codeword.

Lastly, the computed (or table look-up generated) channel bit sequence that represents the SCC codeword parity and the attendant linking bits are appended to the message channel bit sequence via a switch 44 that cooperates with a controller 45 and delay buffer 31 to form the channel bit stream representation of the SCC codeword. During the interval when the parity and link bits are being transmitted, the channel (modulation) encoder is reset to an initial state so that the next message transmitted by it to the SCC encoder will begin with a channel "one".

Selection Of The SCC Code Generator Polynomial

The SCC code generator polynomial g(Z) used by the processor 38 in FIG. 4 is selected via the normal procedures for designing a linear, systematic cyclic code, except that polynomial coefficients are taken from Galois field $GF(p^q)$ where p is simply the number of possible shift states while q is the number of contiguous channel runs that are used to make up an SCC code symbol and is usually chosen to span the anticipated typical shift error. Typically, p=3 (forward shift, backward shift, no shift), while q=1 for single shift error since normally a shift error is an isolated random event (q>1 could be chosen if shift errors occurred in bursts). Thus, in the typical application of this invention, the code generator polynomial g(z) is defined over GF(3) and the shift correction is performed in accordance with a ternary BCH code. The Galois field GF(3) is simply the set of numbers or symbols $-1, 0, 1$. Multiplication and addition in GF(3) are defined in the normal way, except that $1+1=-1$, and $-1-1=+1$. If shift errors occurred in bursts q>1 would be chosen and the shift correction would be performed in accordance with a Reed-Solomon error correcting code over $GF(p^q)$.

Example of SCC Encoding

We will consider the case of using (26,22) BCH code over GF(3) as a single shift error correcting SCC that can detect/correct one shift error (t=1) per codeword. (2,7) RLL modulation code will be assumed. The codeword length is $n=26=3^m-1$; so m=3 and we shall use $m_1(Z)=Z^3-Z+1$, a primitive polynomial of $Z^{26}-1$, to define the locator field $GF(3^3)$. Since t=1, we can take $g(Z)=m_0(Z)m_1(Z)=$ $$(Z-1)(Z^3-Z-1)=Z^4-Z^3-Z^2-Z-1 \text{ as}$$

the generator polynomial for our (26,22) ternary BCH code. Since k=22, the SCC codeword can accommodate a message of at most 22 channel run (x-space) symbols. Since the shortest (2,7) run is D=2 (i.e., "100"), the message part of the SCC word must be 66 channel bits long.

Suppose that the 66 bit long message is as follows:

1000000100000010000001000010000001000100000001000000001
000000010001.

that is, the sequence of x-space runs is (for i=21 to i=0)

$\{x_i\} = \{0,0,0,0,0,0,0,0,0,0,6,6,6,4,6,3,7,7,7,3,0\}$.

Note that we set $x_{21}$ through $x_{11}=0$ since there are only 11 runs in this particular 66 bit long (2,7) sequence. The corresponding s-space and s'-space sequences are:

$\{s_i\} = \{0,0,0,0,0,0,0,0,0,0,6,12,18,$
 $22,28,31,38,45,52,55,55\}$, $\{s_i'\} = \{0, \ldots 0,0,0,0,1,1,1,-1,0,1,1,1\}$.

The message polynomial is then, $C_M(Z) = Z^7+Z^6+Z^5-Z^4+Z^2+Z+1$. Multiplying $C_M(Z)$ by $Z^4$ and dividing (in GF(3)) by g(Z) we obtain as a remainder $R(Z)=-Z^3+Z^2-Z$, so that the 4-tuple $\{1,-1,1,0\}$ is the s'-space representation of the parity symbols. To obtain the x'-space parity checks we solve the four equations $x'_{p3} = 1, x'_{p3}+x'_{p2} = -1,$ $x'_{p3}-x'_{p2}-x'_{p1} = 1$ and $x'_{p3}-x'_{p2}-x'_{p1}+x'_{p0} = 0$ to obtain $x'_{p3}=1$, $x'_{p2}=1$, $x'_{p1}=-1\equiv2$ and $x'_{p0}=-1\equiv2$ (where we have used the fact that $-1\equiv2$ when reducing a number mod 3). Using the simple method of transforming to channel bits, i.e., $x_j = x'_j + D$, we obtain for the parity portion of the SCC codeword $\{x_p\}=\{3,3,4,4,\}$. Note, however, that the sequence $\{x_p\}$ is only 18 channel bits long. Linking bits (which preserve the 2,7 run length constraints) must be added to achieve a parity length equal to 20 channel bits. Noting that $\{x_p\}$ corresponds to the s-space sequence $\{s_{p3}=3, s_{p2}=6, s_{p1}=10, s_{p0}=14\}$ and that $x_{p0}\leq4$ we compute the required number of parity linking bits as $P_L = 20 - (s_{p0}+4)$ and add $P_L$ zeroes to $x_{p0}$ if $P_L \leq 2$ and add a fifth parity run $x_{pL}=(P_L-1)$ if $P_L > 2$ (note that $P_L$ cannot be greater than 8, so that $x_{pL} \leq 7$ as required). Thus the SCC codeword is $$\overbrace{\phantom{xxxxxxxxxxxxxxxxxxxxxxxxx}}^{\text{message}} \overbrace{\phantom{xxxxx}}^{\text{parity}}$$
$$C(Z) = Z^{11} + Z^{10} + Z^9 + Z^8 + Z^6 + Z^5 + Z^4 + Z^3 + Z^2 + 1$$

and its corresponding channel bit run sequence, which has total length equal to $66+3+20=89$ bits is

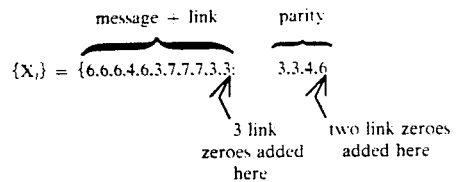

Note that the 2 link bits at the end of the message part are stripped and discarded when the SCC coded channel bit sequence is received by the SCC decoder. Also, if five parity runs were present the decoder would process only the first four runs in the parity portion. Synchronization is maintained by the decoder since it knows that the message and parity parts of the SCC codeword start with a channel "one" and that the message and parity parts are always 66 and 20 channel bits long, respectively, and that three linking channel bits are sandwiched between the message and parity.

The example (26,22) BCH code discussed here is not particularly efficient, but it is pedagogically interesting to calculate its rate, which is $$\frac{66}{66+3+20} = \frac{66}{89} = 0.742$$

The SCC code's rate can be increased by using the alternative (more efficient) method (discussed earlier) for converting the SCC parity checks to channel bits (i.e., parity is a 17 bit long (2,7) sequence ending with $\geq$ two zeroes)

$$\frac{66}{66+3+17} = \frac{66}{86} = 0.767$$

A double error correcting (i.e., corrects two single-shift errors per block) version of our $n=26$ symbol long ternary BCH SCC could be obtained using as a generator polynomial $g(Z) = M_0(Z)M_1(Z)M_2(Z)$, where $M_2(Z)=Z^3+Z^2+Z-1$. ($M_3(Z)$ is not included here since it is the same as $M_1(Z)$.) Thus, $g(Z)$ has degree=7 and our t=2 SCC code is a (26,19) ternary BCH. Since there are seven parity checks, $3^7=2187$ unique parity sequences are possible, so at least a 26 bit long 2,7 sequence that begins with a "one" and ends with two or more zeros is required to represent the parity as a 2,7 RLL channel bit stream. Thus, the maximum rate of this two-error-correcting SCC is $$\frac{(19 \times 3)}{(19 \times 3) + 3 + 26} = \frac{57}{86} = 0.663$$

On the other hand, an $n=242=3^5-1$ symbol long ternary BCH used as a t=1 SCC code would have six parity symbols ($3^6=729$ parities) and if used in conjunction with (2,7) RLL modulation code the rate would be $$\frac{(236 \times 3)}{(236 \times 3) + 3 + 23} = \frac{708}{734} = 0.9646.$$

Another form of the "simple" method of transforming from the parity r-tuple in s'-space to channel bits is to define the range of the elements of $\{x'_p\}$ to be $-1 \leq x'_{pi} \leq +1$ instead of $0 \leq x'_{pi} \leq 2$ as was done earlier, and to use the relation $$x_{pi} = x'_{pi} + (D+1).$$

Thus, for example, the s'-space 4-tuple $\{1, -1, 1, 0\}$ would correspond to $x'_{p3}=1$, $x'_{p2}=1$, $x'_{p1}=-1$, $x'_{p0}=-1$ and $\{x_p\}=\{4,4,2,2\}$ when a D=2 RLL code is used. In this case $S_{p0}=12$ and $P_L=20-(12+4)=4$, so a fifth run $x_{PL}=P_L-1=3$ is added to $\{x_p\}$ to obtain the 20 channel bit long parity sequence.

If this latter method of representing the parity is used, the s-space parity r-tuple can be obtained from the sequence $\{x_p\}$ simply reducing its elements mod 3, which is the same method that is used to determine the s-space representation of the information part of the SCC codeword from the message channel bit runs.

In the detailed example of SCC coding and decoding which follows, the "simple" method in which $0 \leq x'_{pi} \leq 2$ and $x_{pi}=x'_{pi}+D$ is used to generate the SCC codeword's parity channel runs, and thus two different methods must be used to obtain the s-space representations of message and parity parts of the SCC codeword from the received channel runs during the decoding operation.

Channel Bit Representation Of Parity Checks

The "efficient" method (discussed above) of representing the r parity symbols as a RLL constrained sequence of length $l_p$ which begins with a "one" and ends with at least D "zeroes", requires further discussion. So long as the RLL sequence of length $l_p$ has at least $p^r$ (e.g., $p^r=3^7=2187$ in the case of the (26,19) ternary BCH SCC discussed above) unique assignments, it can be used to logically represent the parity r-tuple, i.e., there can be a one-to-one correspondence between every possible parity r-tuple and a unique RLL sequence of length $l_p$. In general, however, many of the $l_p$-bit long RLL sequences will contain less than, or more than, r runs, $x_{pi}$, and so there is not a physical correspondence between the parity symbols $\{s_p\}$ and the $\{x_p\}$. As an example, from Table II (which lists the number of 2,7 sequences having $N_R$ runs ($1 \leq N_R \leq 9$) versus sequence length $l_p$) we see that a $l_p=26$ bit long RLL 2,7 sequence has 80 sequences containing four runs, 735 sequences containing five runs, 1161 containing six runs, 462 with seven runs and 36 with eight runs. Since only 18.6% of the total of 2474 26-bit-long RLL 2.7 sequences contain 7 runs, there are not enough $N_R=7$ run, 26-bit-long sequences to allow one such sequence to correspond to each of the possible $3^7=2187$ parities of a (26,19) ternary BCH code. Thus, if the parity information were recorded (transmitted) using a 26 bit RLL 2.7 sequence, error propogation could occur if a shift error (or a drop-out or drop-in error) contaminated the received parity channel bits, i.e., a single error could corrupt more than one parity symbol. Such error propogation could be pathologic to a random (non-burst) error correcting code such as a BCH code.

One method of mitigating such error propogation is to choose the RLL parity sequence length $l_p$ large enough so that there are enough RLL sequences containing exactly r runs to accommodate the $p^r$ parities. For example, the (26,19) ternary BCH SCC has $p^r=3^7=2187$ and, from Table II, a $l_p=29$ bit long RLL 2.7 sequence has 2807 instances containing seven runs. Thus, the 29 bit RLL 2.7 sequence which begins with a "one" and ends with $\geq 2$ "zeroes" could be used to obtain both logical and physical one-to-one correspondence between the parity 7-tuple, $\{s_p\}$, and the parity part of the recorded (transmitted) channel bit sequence, $\{x_p\}$. It should be noted that the 29 bit RLL 2.7 sequence is 17% shorter than the 35 bit long sequence that would have been required if the simple method (i.e., $x_{pi}=x_{pi}+D$) of mapping parities to channel bit runs had been used.

Another method of mapping parity r-tuples to channel bit sequences in a robust manner involves using a parity channel bit sequence $\{x_p\}$ that is tolerant to inter-symbol interference. Such a sequence could be obtained if one deleted all the shortest runs (i.e., all $x_{pi}=2$) from the sequence $\{x_p\}$. This could be effected by using a (D+1,K) RLL sequence to represent the parity when a (D,K) RLL sequence is used to encode the message information. Table III, which is similar to Table II, shows the distribution of runs contained in 3,7 RLL sequences of length $l_p$. Note that an $l_p=34$ bit long sequence has a total of 2602 instances ($>3^7=2187$) and that a $l_p=36$ bit long RLL sequence has 2415 instances (also $>3^7=2187$) containing exactly seven runs. Thus, either 34 or 36 bit long 3,7 RLL sequences could be used to represent the (26,19) BCH SCC parity 7-tuples with enhanced reliability (relative to using 26 or 29 bit long 2,7 sequences, respectively).

The invention therefore recognizes that various methods can be used to represent the SCC parity as a stream of channel bits and that enhanced reliability of the recorded (transmitted) parity part of the SCC codeword can be obtained by using increasingly longer channel bit sequences $\{x_p\}$ to represent the parity. Of course, this is at the expense of the SCC's code rate.

Finally, it should be mentioned that when the "efficient" method of representing the parity symbols as a constant-length RLL sequence is employed, the mapping of parity r-tuples to channel run sequences should be done in a robust manner. This can be accomplished by insuring that parity r-tuples that differ by more than one element are represented by RLL channel bit sequences that differ by more than one single-shift, so that one single shift error could not transform one sequence to another. Alternatively, parity r-tuples pairs that have two or more different elements should be represented by channel run sequences which would require multiple shift errors to transform one into the other.

TABLE I

Number of 2.7 Constrained Sequences vs. Sequence Length

| Sequence Length, $l_p$ | Number of Sequences beginning with "1" having arbitrary ending | No. of Sequences beginning with "1" and ending with 2 or more "zeroes" |
|---|---|---|
| 13 | 51 | 23 |
| 14 | 73 | 34 |
| 15 | 105 | 48 |
| 16 | 150 | 68 |
| 17 | 214 | 98 |
| 18 | 307 | 141 |
| 19 | 440 | 201 |
| 20 | 629 | 287 |
| 21 | 900 | 412 |
| 22 | 1289 | 590 |
| 23 | 1845 | 843 |
| 24 | 2640 | 1207 |
| 25 | 3779 | 1729 |
| 26 | 5410 | 2474 |
| 27 | 7743 | 3540 |
| 28 | 11082 | 5068 |
| 29 | 15863 | 7255 |
| 30 | 22706 | 10383 |

TABLE II

Number of (2,7) Sequences Having $N_R$ runs vs. Sequence Length*

| Sequence Length, $l_p$ | $N_R=1$ | $N_R=2$ | $N_R=3$ | $N_R=4$ | $N_R=5$ | $N_R=6$ | $N_R=7$ | $N_R=8$ | $N_R=9$ | $N_R=10$ | Total No. Sequences |
|---|---|---|---|---|---|---|---|---|---|---|---|
| 3 | 1 | | | | | | | | | | 1 |
| 4 | 1 | | | | | | | | | | 1 |
| 5 | 1 | | | | | | | | | | 1 |
| 6 | 1 | 1 | | | | | | | | | 2 |
| 7 | 1 | 2 | | | | | | | | | 3 |
| 8 | 1 | 3 | | | | | | | | | 4 |
| 9 | | 4 | 1 | | | | | | | | 5 |
| 10 | | 5 | 3 | | | | | | | | 8 |
| 11 | | 6 | 6 | | | | | | | | 12 |
| 12 | | 5 | 10 | 1 | | | | | | | 16 |
| 13 | | 4 | 15 | 4 | | | | | | | 23 |
| 14 | | 3 | 21 | 10 | | | | | | | 34 |
| 15 | | 2 | 25 | 20 | 1 | | | | | | 48 |
| 16 | | 1 | 27 | 35 | 5 | | | | | | 68 |
| 17 | | | 27 | 56 | 15 | | | | | | 98 |
| 18 | | | 25 | 80 | 35 | 1 | | | | | 141 |
| 19 | | | 21 | 104 | 70 | 6 | | | | | 201 |
| 20 | | | 15 | 125 | 126 | 21 | | | | | 287 |
| 21 | | | 10 | 140 | 205 | 56 | 1 | | | | 412 |
| 22 | | | 6 | 146 | 305 | 126 | 7 | | | | 590 |
| 23 | | | 3 | 140 | 420 | 252 | 28 | | | | 843 |

TABLE II -continued

Number of (2,7) Sequences Having $N_R$ runs vs. Sequence Length*

| Sequence Length, $l_p$ | Number of Sequences having $N_r$ Runs | | | | | | | | | | Total No. Sequences |
|---|---|---|---|---|---|---|---|---|---|---|---|
| | $N_R=1$ | $N_R=2$ | $N_R=3$ | $N_R=4$ | $N_R=5$ | $N_R=6$ | $N_R=7$ | $N_R=8$ | $N_R=9$ | $N_R=10$ | |
| 24 | | | 1 | 125 | 540 | 456 | 84 | 1 | | | 1207 |
| 25 | | | | 104 | 651 | 756 | 210 | 8 | | | 1729 |
| 26 | | | | 80 | 735 | 1161 | 462 | 36 | | | 2474 |
| 27 | | | | 56 | 780 | 1666 | 917 | 120 | 1 | | 3540 |
| 28 | | | | 35 | 780 | 2247 | 1667 | 330 | 9 | | 5068 |
| 29 | | | | 20 | 735 | 2856 | 2807 | 792 | 45 | | 7255 |
| 30 | | | | 10 | 651 | 3431 | 4417 | 1708 | 165 | 1 | 10383 |

*Note
All sequences begin with a "1" and end with at least two "0"s.

TABLE III

Number of (3,7) Sequences Having $N_R$ runs vs. Sequence Length*

| Sequence Length, $l_p$ | Number of Sequences having $N_r$ Runs | | | | | | | | | Total No. Sequences |
|---|---|---|---|---|---|---|---|---|---|---|
| | $N_R=1$ | $N_R=2$ | $N_R=3$ | $N_R=4$ | $N_R=5$ | $N_R=6$ | $N_R=7$ | $N_R=8$ | $N_R=9$ | |
| 4 | 1 | | | | | | | | | 1 |
| 5 | 1 | | | | | | | | | 1 |
| 6 | 1 | | | | | | | | | 1 |
| 7 | 1 | | | | | | | | | 1 |
| 8 | 1 | 1 | | | | | | | | 2 |
| 9 | | 2 | | | | | | | | 2 |
| 10 | | 3 | | | | | | | | 3 |
| 11 | | 4 | | | | | | | | 4 |
| 12 | | 5 | 1 | | | | | | | 6 |
| 13 | | 4 | 3 | | | | | | | 7 |
| 14 | | 3 | 6 | | | | | | | 9 |
| 15 | | 2 | 10 | | | | | | | 12 |
| 16 | | 1 | 15 | 1 | | | | | | 17 |
| 17 | | | 18 | 4 | | | | | | 22 |
| 18 | | | 19 | 10 | | | | | | 29 |
| 19 | | | 18 | 20 | | | | | | 38 |
| 20 | | | 15 | 35 | 1 | | | | | 51 |
| 21 | | | 10 | 52 | 5 | | | | | 67 |
| 22 | | | 6 | 68 | 15 | | | | | 89 |
| 23 | | | 3 | 80 | 35 | | | | | 118 |
| 24 | | | 1 | 85 | 70 | 1 | | | | 157 |
| 25 | | | | 80 | 121 | 6 | | | | 207 |
| 26 | | | | 68 | 185 | 21 | | | | 274 |
| 27 | | | | 52 | 255 | 56 | | | | 363 |
| 28 | | | | 35 | 320 | 126 | 1 | | | 483 |
| 29 | | | | 20 | 365 | 246 | 7 | | | 638 |
| 30 | | | | 10 | 381 | 426 | 28 | | | 845 |
| 31 | | | | 4 | 365 | 666 | 84 | | | 1119 |
| 32 | | | | 1 | 320 | 951 | 210 | 1 | | 1483 |
| 33 | | | | | 255 | 1246 | 455 | 8 | | 1964 |
| 34 | | | | | 185 | 1506 | 875 | 36 | | 2602 |
| 35 | | | | | 121 | 1686 | 1520 | 120 | | 3447 |
| 36 | | | | | 70 | 1751 | 2415 | 1 | | 4567 |
| 37 | | | | | 35 | 1686 | 3535 | 9 | | 6049 |

*Note
All sequences begin with a "1" and end with at least two "0"s.

Shift Correction Code Decoder

Figure 5:
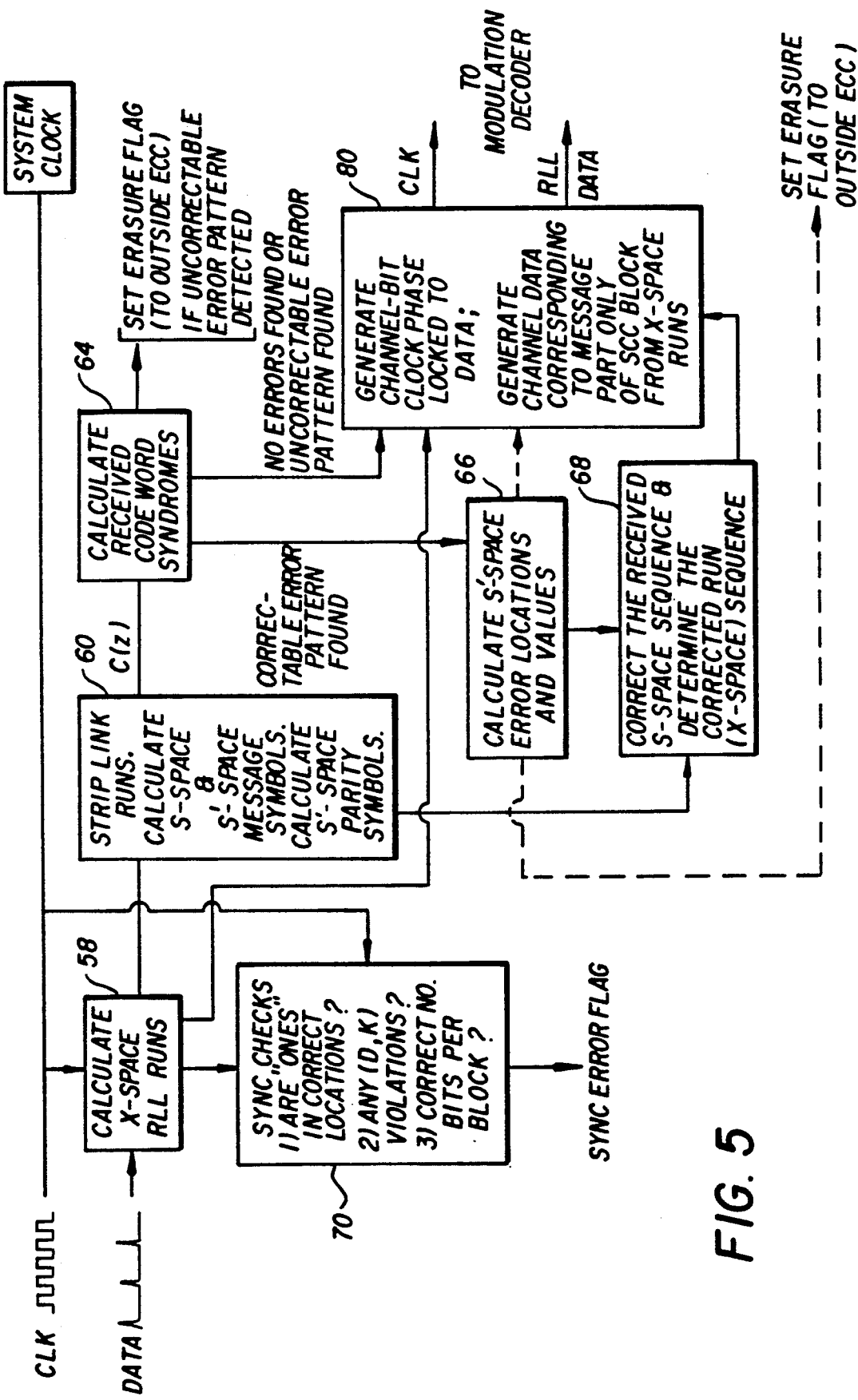
FIG. 5 is a block diagram illustrating the shift correction decoder used in the system of FIG. 2.

The analog "playback" signal from the storage media 10 in FIG. 2 is transformed to binary RLL data (i.e., a sequence of pulses together with a synchronous clock running at the channel bit rate) by the data detector 14 before being sent to the SCC decoder 18. Referring to FIG. 5, the SCC decoder 18 of FIG. 2 includes a counter 58 which generates the x-space RLL runs from the received data and a transform processor 60 which transforms the "x-space" data to s-space and then to "s'-space" symbols; the sequence of s'-space symbols is the received SCC codeword. Note that all linking bits are discarded in these steps and any look-up needed to transform the physical parity sequence $\{x_p\}$ to the corresponding logical parity sequence $\{s'_p\}$ is also done at this time. The received codeword thus consists of a sequence of elements drawn from GF(p) representing the coefficients of the SCC codeword polynomial C(Z). A syndrome processor 64 then computes the partial syndromes $S_j$ by dividing (in GF(p)) the received codeword polynomial C(Z) by the code generator polynomial g(Z) and then evaluating the resulting remainder polynomial at each root of g(Z). These roots are elements of the code locator field GF($3^m$), where $n=3^m-1$, i.e., $$S_j = \text{rem} \frac{C(z)}{g(z)} \bigg|_{z=\alpha^j}.$$

where $\alpha^j$ are sequential roots of g(Z) drawn from the locator field $\alpha^0, \alpha^1, \alpha^2, \ldots, \alpha^N$ (where $N=3^m-1$) generated by the chosen primitive polynomial (of degree m) defining the code. $2t_0$ such $S_j$'s are required, i.e., $m_0 \leq j \leq (m_0 + 2t_0 - 1)$, where j defines the required 2t sequential roots of the code generator polynomial g(z).

If the principal received syndrome $$S = \text{rem} \frac{C(Z)}{g(Z)} = 0$$

(i.e., there are no errors), an enabling signal is sent by processor 64 to processor 80 (in FIG. 6) which sends the RLL encoded message portion of the SCC codeword which is obtained (via processor 58) from the x-space data, together with a synchronized and phase locked channel bit clock signal to the RLL decoder. Processor 80 generates the channel bit stream from the x-space runs obtained from counter 58. If an uncorrectable error pattern is detected by processor 64, the received message channel data, together with the phase locked clock signal, is sent to the RLL decoder, but in addition an erasure flag signal is sent to the outside ECC decoder, thereby indicating that the message channel bits corresponding to the current SCC codeword are corrupted with either an uncorrectable number of shift errors, or by hard (drop-in or drop-out) errors. The processor 64 can be made to immediately recognize an uncorrectable error pattern by referring to a look-up table (i.e., a ROM) which stores the syndromes which correspond to either all the correctable or uncorrectable error patterns. As an example, for the (26,22) ternary BCH SCC which corrects one single shift error that was discussed earlier, there are four parity symbols (drawn from GF(3)) and thus a total of $3^4 = 81$ parities. Since there are only $$\binom{26}{1} \cdot 2 = 52$$

possible single errors in the n=26 symbol codeword, we have a total of 52 non-zero parities that correspond to correctable error patterns. (As used in this specification, the expression $$\binom{X}{Y}$$

is defined as:

$$\binom{X}{Y} = \frac{X!}{(X-Y)!Y!}$$

for X>Y.) There are then $81 - 52 = 29$ syndromes that correspond to uncorrectable (but detected) error patterns.

In many cases the SCC used will be designed to correct 3 or fewer single-shift errors and so the size of the look-up table used to store the parities will be relatively small. This method of determining whether the error pattern is correctable or not should be used to reduce SCC decoding delay. In fact, in such systems it would be practical to effect error correction via this look-up table as well. However, we shall proceed now to describe the more general case of decoding that would apply to codes designed to correct many errors.

If a correctable error pattern is detected by processor 64, an enabling signal is sent to processor 66 which utilizes the $2t_0$ partial syndromes $S_j$ to determine the error locations and error values via one of the conventional methods. For example, the error locations could be obtained by determining the $v$ roots of the error locator polynomial ($1 \leq v \leq t_0$)

$$\Sigma(\xi) = \xi^v - \sigma_1 \xi^{(v-1)} + \sigma_2 \xi^{(v-2)} - \ldots + (-1)^{(v-1)} \sigma_{v-1} \xi + (-1)^v \sigma_v = 0$$

using the $t_0$ equations ($m_0 \leq j \leq m_0 + 2t_0 - 1$)

$$S_j \sigma_v - S_{j-1} \sigma_{v-1} - S_{j-2} \sigma_{v-2} - \ldots + (-1)^{(v-1)} S_{j-v-1} \sigma_1 + (-1)^v S_{j-v} = 0$$

$$S_{j-(t_0-1)} \sigma_v - S_{j-t_0} \sigma_{(v-1)} - S_{j-(t_0-1)} \sigma_{(v-2)} - \ldots + (-1)^{(v-1)} S_{j-(t_0-v-2)} \sigma_1 + (-1)^v S_{j-(t_0-v-1)} = 0$$

to determine the coefficients $\sigma_1, \sigma_2, \ldots, \sigma_v$ (all computation being done in GF(p)). Once the error locations $\xi_i$, $1 \leq i \leq t_0$, are thus determined, the $v \leq t_0$ equations (v is the actual number of errors)

$$S_j = \sum_{i=1}^{v} Y_i \xi_i^j$$

are solved (again in GF(p)) to determine the error values $Y_i$. The $Y_i$ are elements of GF(p), while the $\xi_i$, $S_j$ and $\sigma_i$ are elements of the locator field GF($p^m$) generated by the code's primitive polynomial.

Note that in the case where a look-up table was not used by the syndrome calculator to determine whether or not the detected error pattern was correctable, one would not know that an uncorrectable pattern occurred until the process of determining the roots of the error locator polynomial failed. In such a case the processor 66 would signal the erasure information to the outside ECC and instruct a data generator 80 to pass the x-space runs obtained from the processor 58 to the channel decoder (such operation is illustrated by the dashed lines in FIG. 5).

The processor 68 then uses the s'-space representation of the error pattern to correct the received s'-space sequence obtained from the processor 60 (via addition in GF(p)) and subsequently calculates the corrected RLL run sequence (x-space) from the corrected s-space sequence by solving the set of equations $$S_j = \sum_{i=j}^{n-1} x_i$$

for j=0 to j=(n−1), where n is the codeword length. The corrected x-space runs that correspond to the k message runs are next sent to the generator 80, which uses them to generate the channel data and clock to be sent to the modulation decoder. Circuitry 70 which provides enhanced sync error detection can also be included as part of the SCC decoder. The sync check enhancements that are available are based on the block nature of the SCC codewords, i.e., sync errors can rapidly be detected if channel ones do not occur at the start of the message and parity portions of the block, or if an incorrect number of channel bits are found in a block. These sync error checks are independent of, and in addition to, the automatic phasing properties of the SCC code which were discussed earlier.

Working Example of the SCC Encoding/Decoding System

In the following working example, it is assumed that, due to channel noise, two single shift errors are present in the SCC codeword received by the SCC decoder 18, and that a (26,19) ternary (GF(3)) BCH code is employed to effect shift error correction. We will also assume that (2,7) RLL modulation code is used. Thus, the SCC code length is $n = 26 - 3^m - 1$, so that $m = 3$ and the locator field is $GF(3^3)$ which is generated by $m_1(Z) = Z^3 - Z + 1$, a primitive polynomial of $Z^{26} - 1$. We take the generator polynomial $g(Z) = m_0(Z) m_1(Z) m_2(Z) = (Z-1)(Z^3 - Z + 1)(Z^3 + Z^2 + Z - 1) = Z^7 - Z^5 - Z^4 + Z^3 - Z^2 + 1$. Thus, our code corrects up to $t_0 = 2$ errors and $g(Z)$ has consecutive roots $\alpha^0, \alpha^1, \alpha^2, \alpha^3$ which are elements of $GF(3^3)$ (see FIG. 6).

Suppose the input message (of length 19 symbols = 57 bits) is the channel run sequence given by $$\{x_M\} = \{0,0,0,0,0,0,0,0,3,3,3,4,6,3,7,7,7,3,0\}$$

$$\{s_M\} = \{0,0,0,0,0,0,0,0,3,6,9,13,19,22,29,36,43,46,46\}$$

$$\{s'_M\} = \{0,0,0,0,0,0,0,0,0,0,1,1,1,-1,0,1,1,1\}$$

so that the message polynomial is $$C_M(Z) = Z^7 + Z^6 + Z^5 - Z^4 + Z^2 + Z - 1.$$

and the shifted message polynomial is $$\hat{C}_M(Z) = C_M(Z) \cdot Z^7 = Z^{14} + Z^{13} + Z^{12} - Z^{11} + Z^9 + Z^8 + Z^7.$$

Dividing by $g(Z)$ we find that the parity polynomial is $P(Z) = Z^6 - Z^4 + 1$, which corresponds to parity sequences $\{s_p\} = \{+1, 0, -1, 0, 0, 0, +1\}$ and $\{x'_p\} = \{+1, -1, -1, +1, 0, 0, +1\}$. The SCC codeword is thus represented by the polynomial $$C(Z) = \hat{C}_M(Z) + P(Z) = Z^{14} + Z^{13} + Z^{12} - Z^{11} + Z^9 + Z^8 + Z^7 + Z^6 - Z^4 + 1.$$

In this example there are seven parity check symbols and thus there are $3^7 = 2187$ unique parity sequences $\{S_p'\}$. Each of these sequences could be represented by one of the more than 2800 (2,7) RLL constrained channel bit patterns of length 29 bits which contain seven runs and begin with a "one" and end in two or more "zeroes" (cf., Table II). Thus, the parity part of the channel bit representation could be a 2,7 RLL sequence of length 29 bits. In this example, however, we shall use the simple method of mapping parity to its channel run representation, i.e., the parity part of the word transmitted by the SCC encoder is $$\{x_p\} = \{3,4,4,3,2,2,3,6\}.$$

Note that an eighth run of length six has been added to bring the sequence $\{x_p\}$ to its required length of 35 channel bits.

The entire sequence transmitted by the SCC encoder is then $$\{x_t\} = \{3,3,3,4,6,3,7,7,7,3,3,3,4,4,3,2,2,3,6\}$$

which has length of $95 = (57+3+35)$ bits. (Note that three linking bits have been added to $x_{t7}$, the last run in the message part of the word, as required.) Suppose that two single-shift errors occur in the runs $x_{t0}$ and $x_{t9}$ so that the received run sequence $$\{x_R\} = \{3,3,3,4,6,3,7,7,6,4,3,3,4,4,3,2,2,4,5\}$$

shift  shift
error  error is output by the x-space calculator circuit 58 in FIG. 5. The received s-space and s'-space sequences of the message part of the word are determined by processor 60 to be $$\{s_{RM}\} = \{0,0,0,0,0,0,0,0,3,6,9,13,19,22,29,36,42,46,46\}$$

$$\{s'_{RM}\} = \{0,0,0,0,0,0,0,0,0,0,1,1,1,-1,0,0,1,1\}$$

(Note that the three linking bits which were added to the last message run were discarded.) The parity is obtained (via the processor 60) by first subtracting $D = 2$ from each of the first seven runs in the received parity part of $\{x_R\}$ to obtain $$\{x'_{Rp}\} = \{1,-1,-1,1,0,0,-1\}$$

and then solving the set of equations $$s'_j = \sum_{i=6}^{j} x_i, \text{ for } j = 6 \text{ to } j = 0$$

to obtain $$\{s'_{Rp}\} = \{1,0,-1,0,0,0,-1\}$$

so that the received codeword output by processor 60 is $$C(Z) = \underbrace{Z^{14} + Z^{13} + Z^{12} - Z^{11} + Z^8 + Z^7}_{\text{message} \cdot Z^7} + \underbrace{Z^6 - Z^4 - 1}_{\text{parity}}.$$

The syndrome calculator 64 now finds $$S(Z) = \text{rem}\frac{C(Z)}{g(Z)} = -Z^6 + Z^4 + Z^3 - 1$$

and since $S(Z) \neq 0$ errors are present. Now in this case there are $3^7 = 2187$ possible non-zero syndromes and $$\binom{26}{2} \times 4 + \binom{26}{1} \times 2 = 1352$$

correspond to all possible double or single error patterns. The remaining 835 would be stored in a ROM which is interrogated by the syndrome calculator 64 to determine if the error pattern is correctable. We shall assume that the syndrome $S(Z)$ computed above represents a correctable error pattern and proceed.

Processor 64 then calculates four partial syndromes (using the known values of the locator field $GF(3^3)$[cf., FIG. 6].

$$S_0 = S(Z)|_{Z=\alpha^0} = -(\alpha^0)^6 + (\alpha^0)^4 + (\alpha^0)^3 - 1 = 0$$

$$S_1 = S(Z)|_{Z=\alpha1} = -\alpha^6 + \alpha^{4-\alpha^3} - 1 = \alpha^{14}$$

$$S_2 = S(Z)|_{Z=\alpha2} = -\alpha^{12} + \alpha^8 + \alpha^6 - 1 = \alpha^{17}$$

$$S_3 = S(Z)|_{Z=\alpha3} = -\alpha^{18} + \alpha^{12} + \alpha^9 - 1 = \alpha^{16}$$

and passes them on to the processor 66. The processor 66 solves the two equations $$S_0\sigma_2 - S_1\sigma_1 + S_2 = 0$$

$$S_1\sigma_2 - S_2\sigma_1 + S_3 = 0$$

to obtain $$\sigma_2 = \frac{(S_2^2 - S_1 S_3)}{(S_1^2 - S_0 S_2)} = \alpha^9$$

$$\sigma_1 = \frac{(S_2 - S_0\sigma_2)}{S_1} = \alpha^3$$

and finds the roots of the error locator polynomial $$\Sigma(Z) = Z^2 - \alpha^3 Z - \alpha^9 = 0 \text{ to be } Z_1 = \alpha^9 \text{ and } Z_2 = \alpha^0.$$

Finally, the processor 60 uses the equations $$S_0 = Y_1 - Y_2$$

$$S_1 = Y_1 Z_1 - Y_2 Z_2$$

$$S_2 = Y_1 Z_1^2 - Y_2 Z_2^2$$

$$S_3 = Y_1 Z_1^3 - Y_2 Z_2^3$$

to obtain the error values $Y_1 = -1$ and $Y_2 = 1$.
Thus the error pattern is found to be $$e(Z) = -x^9 + 1.$$

The processor 68 recognizes that only one of the two detected errors (i.e., $-x^9$) resides in the message portion of the SCC codeword; it corrects the received s-space sequence $\{s_{MR25}, s_{MR24}, s_{MR23}, \ldots, s_{MR7}\}$ (obtained via the processor 60) by subtracting +1 from the element $S_{MR9}$ to obtain the corrected message sequence.

$$\{s_M\} = \{0,0,0,0,0,0,0,0,3,6,9,13,19,22, 29,36,43,46,46\}$$

and calculates the corrected channel run sequence $$\{x_M\} = \{3,3,3,4,6,3,7,7,7,3,0\}.$$

$\{x_M\}$ is subsequently passed to the data generator 80, which sends the corrected 57 bit long RLL channel bit sequence, together with a phased clock, to the RLL modulation decoder.

Byte Interleaving of the Concatenated Codes

It is well-known that a typical ECC decoder, such as the decoder 26 illustrated in FIG. 2, can correct twice as many erased symbols as it can erroneous symbols, provided the locations of the erasures are known before-hand. For example, in a Reed-Solomon code, the number of check symbols, R, must be twice the number of expected erroneous symbols. In the presence of erasures, R must be equal to the number of erasured symbols plus twice the number of erroneous symbols. The fact that an ECC decoder can handle more erasures than errors is exploited in this invention so as to enhance the overall ability of the system of FIG. 2 to handle noise-induced shift errors and/or "hard" defect related errors in the channel encoded data. Specifically, referring to FIG. 2 and FIG. 5, whenever the shift correction decoder 18 and specifically the error correction processor 66 cannot solve the simultaneous equations (or in the case in which lookup table decoding is used, when syndrome calculator 64 determines that the error pattern is uncorrectable), the system knows that the number of shift errors in the received SCC codeword exceeds its capacity and, in one embodiment of the invention, flags this condition to the ECC decoder 26 via a flag channel 27 illustrated in FIG. 2. The presence of a flag on the flag channel 27 causes the ECC decoder to treat the concurrent data as an erasure.

Figure 7A:
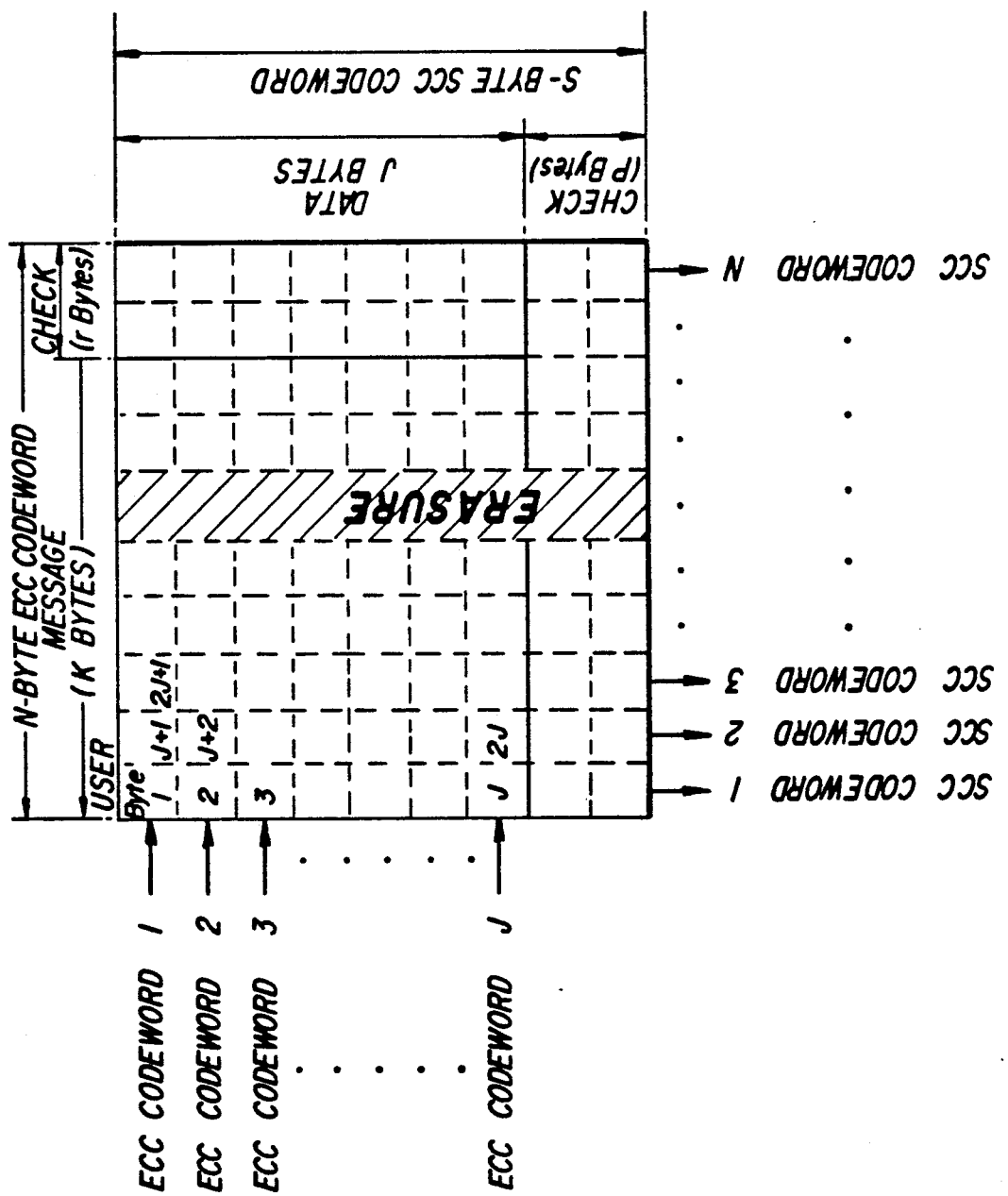
FIGS. 7a and 7b illustrate the interleaving of the error correction code codewords with the shift correction code codewords in accordance with one embodiment of the invention.

By byte-interleaving a succession of J ECC codewords such that each interleave forms an SCC codeword, as illustrated in FIG. 7a, a sustained erasure in the channel encoded data (deleting, for example, an entire SCC codeword) appears to the ECC decoder 26 as merely the erasure of a single byte symbol in each of the J ECC codewords, such a single erasure being easily corrected by the ECC decoder 26. In FIG. 7a, the first byte of user data in each of the J ECC codewords becomes an equivalent number of channel bits in the first SCC codeword. Likewise, the second byte in each ECC codeword becomes an equivalent number of channel bits in the second SCC codeword. Preferably, such two-dimensional interleaving is performed by the ECC encoder 24 using a memory having an architecture corresponding to the arrangement illustrated in FIG. 7a. Likewise, the ECC decoder 26 de-interleaves such data using a memory having the same architecture but operating in reverse. Thus, each group of J ECC codewords would be stored as a block in such a memory, so that N SCC codewords could be read out therefrom, as illustrated in FIG. 7a. An alternative architecture would have more than one, but an integer number, of SCC codewords mapped into a single interleave or a multiple number of interleaves of the outside ECC codeword.

Figure 7B:
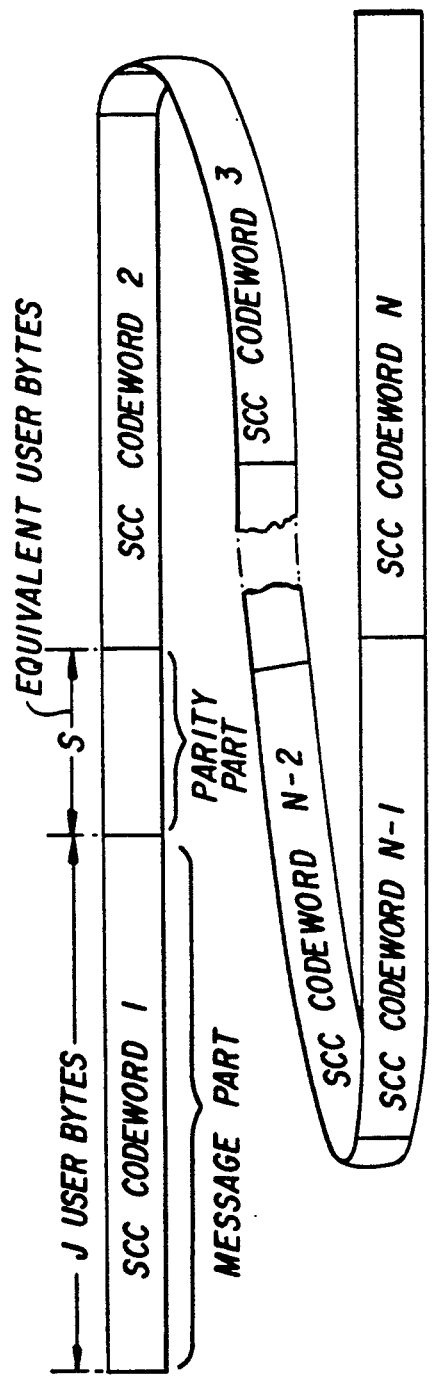

For the two-dimensional interleaving configuration shown in FIG. 7a, the data actually stored and retrieved from the storage media 10 has the form illustrated in FIG. 7b. The message portion of each SCC codeword encompasses J ECC codeword bytes. The channel bits that correspond to the SCC codeword parity portion are not two-dimensionally interleaved with the outside ECC since that data is never obtained from the outside ECC encoder or passed to the outside ECC decoder (it is calculated within the SCC encoder and eventually discarded after being used by the SCC decoder). The overhead of the SCC can be expressed as S equivalent user bytes, which is the equivalent user data that could have been placed in the parity part of the SCC block. In FIG. 7b, $S = L_p R/8$, where $L_p$ is the number of RLL channel bits in the SCC parity part and R is the RLL code rate (user bits per channel). The transmitted and received data illustrated in FIG. 7b therefore amounts to a serial succession of SCC codewords. The erasure illustrated in crosshatching in FIG. 7a occurs in the sixth SCC codeword. Thus, the flag transmitted by the SCC decoder 18 to the ECC decoder 26 on the flag channel 27 simply informs the ECC decoder that the sixth byte in each ECC codeword it receives comprises an erasure. This gives the location of the erasure, which is all the ECC decoder needs to take advantage of the fact that it can handle twice as many erasures as it can errors.

It is understood, of course, that the detailed description given herein uses examples whose main virtue is tutorial clarity, it being understood that other forms or designs may be used. For example, each of the individual processing blocks illustrated in FIGS. 4 and 5 in connection with the SCC encoder and SCC decoder, repectively, may be combined in part or in whole using standard digital signal processing integrated circuit chips or using a single custom chip to perform the entire task (in which case some or all of the blocks illustrated in FIG. 4 or in FIG. 5 may be combined in a single block). Furthermore, the working examples given illustrate single and double single shift error correction capability, it being understood that any multiple shift error correction capability may be chosen in implementing the invention. A ternary code in Galois field $GF(3^m)$ was used in the working examples (where $m=1$ for the random error correcting BCH code used in the example). However, it is known that equivalent multiple shift error correcting BCH codes can be constructed over $GF(p^m)$ where p is an odd integer $\geq 3$ or from negacyclic codes, such as those described by Elwyn R. Berlekamp in *Algebraic Coding Theory*, McGraw-Hill, 1968 in Chapter 9. Accordingly, the invention is not restricted to a particular code structure, nor is it restricted to a particular format for interleaving ECC and SCC codewords, such as that illustrated in FIG. 7. In fact, the invention does not always require such interleaving.

Accordingly, while the invention has been described in detail with specific reference to preferred embodiments thereof, it is understood that other variations and modifications may be made without departing from the spirit and scope of the invention.

What is claimed is:

1. A data processing system associated with a channel, comprising:
    channel encoder means for transforming a stream of digital data to a stream of binary data in accordance with a run length limited code for transmission through said channel;
    channel decoder means for receiving from said channel a stream of binary data encoded by said channel encoder means and transforming it to digital data in accordance with said run length limited code; and
    a shift correction encoder connected between said channel encoder means and said channel and comprising:
        first means for transforming a block of binary symbols in said binary data stream to a block of symbols of a first field;
        second means for transforming said block of symbols of said first field to produce a block of k elements of a finite field;
        third means for computing r redundant check symbols from said k finite field elements in accordance with a first code over said finite field, wherein said k finite field elements and said r redundant check symbols comprise a first codeword comprising $n=k+r$ symbols of said finite field; and
        fourth means for transforming said r redundant check symbols to a sequence of binary symbols in accordance with constraints of said run length limited code and transmitting them to said channel so that they are appended to said block of binary symbols in said stream of binary data, wherein said first means comprises means for sensing the number of consecutive binary zeroes between successive binary ones in said stream of channel encoded binary data, whereby said first field is a field of natural numbers.

2. The data processing system of claim 1 wherein said first means further comprise means for transforming each of said first field symbols into a transformed first field symbol comprising the sum of said first field symbol with previous first field symbols and sending said transformed first field symbol to said second means instead of said first field symbol, whereby a single shift error in said stream of binary data changes only one of said transformed first field symbols.

3. The data processing system of claim 2 wherein said fourth means comprise;
    means for inverse transforming said r redundant check symbols to r symbols of said first field, wherein each of said r check symbols is the sum of the corresponding first field symbol with its predecessors from the set of r first field symbols; and
    means for channel encoding said r first field symbols to binary symbols in accordance with said run length limited code, whereby said binary symbols encoded from said r first field symbols are appended to said block of binary symbols in said channel.

4. The data processing system of claim 1 wherein said second means comprises means for reducing said first field symbols modulo an odd integer p, wherein said finite field is the Galois field $GF(p^m)$, m being an integer.

5. The data processor of claim 4 wherein p corresponds to the longest bit length of a correctable shift error in said stream of binary data and m corresponds to the number of contiguous runs in said run length limited code corresponding to a single symbol in said first code.

6. The data processing system of claim 1 further comprising a shift correction decoder connected between said channel and said channel decoder means and comprising:
    fifth means for receiving a block of binary symbols from said channel and transforming them to n symbols of said first field,
    sixth means for transforming said n first field symbols to n symbols of said finite field,
    seventh means for producing from said n finite field symbols a received version of a first codeword in accordance with said first code and decoding said received version of a first codeword to produce an error pattern comprising symbols of said finite field,
    eighth means for using said error pattern to correct said received version of a first codeword to produce a corrected codeword and transforming appropriate symbols of said corrected codeword into binary data in accordance with said run length limited code.

7. The data processing system of claim 6 further comprising means for detecting the locations of successive first codewords and deriving therefrom synchronization or resynchronzation signals or both for use by said channel decoder.

8. The data processing system of claim 6 further comprising:
    an error correction encoder adapted to furnish said stream of digital data to said channel encoder, wherein said steams of digital data comprises a succession of error correction codewords, each error correction codeword including N error correction codeword symbols in accordance with an error correction code;

an error correction decoder adapted to receive digital data from said channel decoder means as successive blocks of N symbols per block and to decode each said block as an error correction codeword so as to remove errors in said block; and an interleaver included in said error correction encoder and adapted to cause the channel encoded version of k error correction codeword symbols from different error correction codewords to be treated by said shift correction encoder as the k information symbols of a first codeword from which it computes a corresponding set of r check symbols in accordance with said first code, whereby said eighth means produces a succession of interleaved error correction codewords;

a de-interleaver included in said error correction decoder and adapted to sort the k information symbols of each first codeword provided by said eighth means into k corresponding error correction codewords, whereby a burst of continuous shift errors cause no more than a single symbol error in any one of the interleaved error correction codewords.

9. The data processing system of claim 8 further comprising means responsive whenever the error correction capacity of said shift error correction decoder is exceeded for notifying said error correction decoder of the corresponding locations in the interleaved error correction codewords, whereby said error correction decoder treats said corresponding locations as erasures, thereby enhancing its error correction performance in the presence of said burst errors.

10. The data processing system of claim 6 wherein said fifth means comprise means for counting the number of consecutive zeroes between successive ones in said stream of binary data, said number corresponding to a given one of said first field symbols.

11. The data processing system of claim 10 wherein said sixth means comprise:
   means for computing the sum of each of said first field symbols in said block with its predecessors to produce a set of n transformed first field symbols,
   means for reducing each of said n transformed first field symbols modulo p.

12. The data processing system of claim 11 wherein said seventh means comprises means for decoding said n finite field symbols in accordance with said first code and for treating r of said n finite field symbols as redundant check symbols.

13. A method for correcting time shift errors in data encoded in accordance with a run length limited (RLL) code characterized by run lengths of consecutive binary symbols of a first kind separated by binary symbols of a second kind, said RLL encoded data being transmitted and received on a channel, said method comprising:
   encoding said RLL data prior to its being transmitted on said channel in accordance with a first code, wherein successive run lengths in said RLL data are transformed to corresponding elements of GF($p^m$) so that redundant check symbols are computed and appended to said corresponding elements of GF($p^m$) to form a codeword of said first code; and
   decoding RLL data received from said channel by transforming successive run lengths in said RLL data to corresponding elements of Galois field GF($p^m$) to form a received version of a codeword of said first code and decoding said received codeword to recover a corrected codeword, wherein p is 1+twice the distance in bits of the longest correctable shift error in said RLL data and m is an integer.

14. The method of claim 13 wherein the transforming step in said decoding step and the transforming step in said encoding step each comprise:
   computing the sum of each run length in said RLL data with previous run lengths therein; and
   reducing said sum modulo p to produce the corresponding element in Galois field GF($p^m$).

15. The method of claim 13 wherein said first code lies in the class of codes including linear codes, cyclic codes and negacyclic codes.

16. The method of claim 13 wherein said shift correction code is characterized by a fixed channel data block length.

17. A shift correction system for correcting time shift errors in run length limted (RLL) channel encoded data received from a channel, said data consisting of runs that are characterized by a run bit (such as 0) and a separation bit (such as 1), wherein such time shift errors cause as many as t separation bits in a block of said data to shift position with respect to the position of other bits in said RLL data in as many as p possible states, p being at least three (forward shift, backward shift, no shift), said system comprising:
   first means for receiving a block of digital symbols which are to be run length limited channel encoded;
   second means for channel encoding said block of symbols in accordance with a run length limited code to generate a block of RLL encoded data;
   third means for transforming each run length in said block of RLL encoded data to an element of a Galois field related to GF($p^m$) so as to generate a corresponding block of GF($p^m$) related symbols;
   fourth means for encoding said block of GF($p^m$) related symbols in accordance with a first code related to GF($p^m$) so as to generate a set of redundant check elements from GF($p^m$);
   fifth means for channel encoding said redundant check elements into a check block of RLL encoded data, and appending said check block to said block of RLL data to from a shift correction RLL data block and transmitting said RLL data block to said channel;
   sixth means for receiving run length limited encoded data from said channel as a received encoded RLL data block;
   seventh means for transforming each run length in said received data block into an element of said Galois field to form a received codeword; and
   eighth means for decoding said received codeword in accordance with said first code.

18. The shift correction system of claim 17 wherein said eighth means comprises means for generating a corrected codeword in accordance with said first code, said corrected codeword comprising elements of said Galois field, said system further comprising:
   ninth means for inverse transforming said corrected codeword from said Galois field elements to a corrected block of RLL encoded data; and
   means for channel decoding at least a portion of said corrected block of RLL encoded data to generate a corrected block of digital symbols that is free of the effects of time shift errors.

19. The shift correction system of claim 17 wherein said eighth means comprises means for detecting a number of shift errors in said received codeword exceeding a certain threshold related to the error correction capacity of said first code and for generating an erasure flag indicative thereof.

20. The shift correction system of claim 17 wherein $p = 1 +$ twice the distance of the longest correctable shift error.

21. The shift correction system of claim 17 wherein each shift error in a given separation bit causes two adjacent run lengths of consecutive run bits separated by a separation bit in the received shift correction RLL data block to be in error, and wherein said third and seventh means each further comprise means for initially transforming each said run length so that a shift error causes only a corresponding single Galois field symbol to be in error.

22. The shift correction system of claim 21 wherein said means for initially transforming comprises means for computing the sum of each run length in said RLL encoded data block with previous run lengths therein.

23. The shift correction system of claim 22 wherein said third and seventh means each further comprise means for reducing modulo p the sum computed by said means for initially transforming, so as to generate an element of $GF(p^m)$.

24. The shift correction system of claim 17 further comprising an error correction code (ECC) encoder having an output connected to said first means, wherein said block of received data comprises an ECC codeword having N symbols; and an error correction code (ECC) decoder having an input connected to receive said corrected digital symbols, wherein said corrected block of digital symbols comprise ECC encoded data decodable by said ECC decoder.

25. The shift correction system of claim 24 further comprising means for facilitating notification from said shift correction decoding means to said ECC decoder whenever said shift correction decoding means fails, so that said ECC decoder treats data concurrent with each such notification of failure as an erasure location.

26. The shift correction system of claim 25 further comprising means for interleaving each of N symbols of said ECC codeword into J shift correction codewords, whereby J ECC codewords are interleaved symbol by symbol into N shift correction codewords, so that said notification of failure causes said ECC decoder to treat as an erasure location the same symbol location in each of said J ECC codewords.

27. A process for correcting shift errors in a block of run length limited (RLL) channel encoded data in a channel, wherein shift errors cause as many as t separation bits in said block of channel encoded data each to be shifted by as many as $(p-1)/2$ bit positions, wherein p is at least 3 (one bit forward, one bit back, no shift), said process comprising:

run length limited encoding a set of digital symbols to generate a block of RLL data, converting each run length in said RLL data block to an element of a Galois field related to $GF(p^m)$ so as to form a block of Galois field symbols;

encoding said Galois field symbol block in accordance with a first code related to $GF(p^m)$ so as to compute a set of check symbols from said Galois field; and RLL encoding said set of check symbols from said Galois field to produce a check block of RLL data and appending said check block to said RLL data block to form a shift correction RLL data block, and transmitting said shift correction RLL data block to said channel.

28. The process of claim 27 wherein said shift correction code is characterized by a fixed channel data block length.

29. The method of claim 27 further comprising:

receiving a received version of said shift correction RLL data block and transforming each run length therein into an element of said Galois field to form a received codeword;

decoding said received codeword in accordance with said first code so as to generate a corrected codeword; and generating a shift corrected RLL data block from said corrected codeword and channel decoding said shift corrected RLL data block to form a shift corrected set of digital symbols.

30. The shift correction process of claim 29 wherein said set of digital symbols comprises an error correction codeword (ECC) comprising N ECC symbols and wherein said shift correction codeword comprises J Galois field symbols and P redundant Galois field check symbols, and wherein said encoding step comprises interleaving symbol by symbol J error correction codewords into N shift correction codewords, said process further comprising;

during said decoding step, de-interleaving N shift corrected sets of digital symbols into J error correction codewords for transmittal to an error correction decoder and notifying said error correction decoder whenever said decoding step fails to decode a given shift correction codeword, whereby said error correction decoder may treat the corresponding failure as the erasure of single corresponding bytes in said J error correction codewords.

* * * * *

UNITED STATES PATENT AND TRADEMARK OFFICE
CERTIFICATE OF CORRECTION

PATENT NO. : 5,220,568
DATED : June 15, 1993
INVENTOR(S) : Dennis G. Howe, Edward J. Weldon, Jr., Hugh M. Hilden It is certified that error appears in the above-indentified patent and that said Letters Patent is hereby corrected as shown below:

In the Abstract, Line 8
    Delete "negacyclic" and insert --neglacyclic--

Column 28, Line 43
    Delete "from" and insert --of--

Signed and Sealed this

Twelfth Day of April, 1994

Attest:

BRUCE LEHMAN

*Attesting Officer*      *Commissioner of Patents and Trademarks*